United States Patent
Bouchard et al.

(10) Patent No.: US 8,633,693 B2
(45) Date of Patent: Jan. 21, 2014

(54) ROTATING-FRAME GRADIENT FIELDS FOR MAGNETIC RESONANCE IMAGING AND NUCLEAR MAGNETIC RESONANCE IN LOW FIELDS

(75) Inventors: Louis-Serge Bouchard, Berkeley, CA (US); Alexander Pines, Berkeley, CA (US); Vasiliki Demas, Boston, MA (US)

(73) Assignee: The Regents of The University of California, Oakland, CA (US)

( * ) Notice: Subject to any disclaimer, the term of this patent is extended or adjusted under 35 U.S.C. 154(b) by 544 days.

(21) Appl. No.: 12/594,341

(22) PCT Filed: Apr. 2, 2008

(86) PCT No.: PCT/US2008/059183
§ 371 (c)(1),
(2), (4) Date: Oct. 1, 2009

(87) PCT Pub. No.: WO2008/154059
PCT Pub. Date: Dec. 18, 2008

(65) Prior Publication Data
US 2010/0085048 A1 Apr. 8, 2010

Related U.S. Application Data

(60) Provisional application No. 60/909,631, filed on Apr. 2, 2007.

(51) Int. Cl.
*G01V 3/00* (2006.01)
(52) U.S. Cl.
USPC .......................................... 324/309; 324/307
(58) Field of Classification Search
USPC ................... 324/307, 309, 310, 312
See application file for complete search history.

(56) References Cited

U.S. PATENT DOCUMENTS

| | | | | |
|---|---|---|---|---|
| 4,301,410 A | * | 11/1981 | Wind et al. | 324/307 |
| 4,475,084 A | * | 10/1984 | Moore et al. | 324/309 |
| 4,727,325 A | | 2/1988 | Matsui et al. | |
| 4,968,939 A | | 11/1990 | Pines et al. | |
| 6,159,444 A | | 12/2000 | Schlenga et al. | |

(Continued)

FOREIGN PATENT DOCUMENTS

| WO | WO 98/12964 A1 | 4/1998 |
|---|---|---|
| WO | WO 2006/923297 A2 | 3/2006 |
| WO | WO 2008/024092 A2 | 2/2008 |

OTHER PUBLICATIONS

Bouchard, L. S., Quadrature Rotating-Frame Gradient Fields for Ultra-Low Field Nuclear Magnetic Resonance and Imagining, Lawrence Berkeley National Laboratory Paper LNBL-59283, Jan. 5, 2006.

(Continued)

*Primary Examiner* — Louis Arana
(74) *Attorney, Agent, or Firm* — Knobbe, Martens, Olson & Bear LLP

(57) ABSTRACT

A system and method for Fourier encoding a nuclear magnetic resonance (NMR) signal is disclosed. A static magnetic field $B_0$ is provided along a first direction. An NMR signal from the sample is Fourier encoded by applying a rotating-frame gradient field $B_G$ superimposed on the $B_0$, where the $B_G$ comprises a vector component rotating in a plane perpendicular to the first direction at an angular frequency $\omega$ in a laboratory frame. The Fourier-encoded NMR signal is detected.

50 Claims, 11 Drawing Sheets

(56) References Cited

U.S. PATENT DOCUMENTS

| | | | |
|---|---|---|---|
| 6,426,058 B1 | 7/2002 | Pines et al. | |
| 6,652,833 B2 | 11/2003 | Pines et al. | |
| 6,674,282 B2 | 1/2004 | Pines et al. | |
| 6,818,202 B2 | 11/2004 | Pines et al. | |
| 6,885,192 B2 | 4/2005 | Clarke et al. | |
| 7,245,125 B2* | 7/2007 | Harer et al. | 324/310 |
| 7,750,633 B2* | 7/2010 | Pines et al. | 324/309 |

OTHER PUBLICATIONS

Bouchard, L. S., Unidirectional Magnetic-Field Gradients and Geometric-Phase Errors During Fourier Encoding Using Orthogonal AC Fields, Physical Review B, 2006, pp. 054103-1-054103-11, vol. 74.

Cory, D. G., New Approaches to NMR Imaging in a Rotating Field Gradient, Journal of Magnetic Resonance, 1989, pp. 337-341; vol. 82, No. 2.

Meriles, C. A. et al. Theory of MRI in the Presence of Zero to Low Magnetic Fields and Tensor Imaging Field Gradients, Journal of Magnetic Resonance, 2006, pp. 106-114, vol. 182, Elsevier.

Yablonskiy, D. A. et al., Image Artifacts in Very Low Magnetic Field MRI: The Role of Concomitant Gradients, Journal of Magnetic Resonance, 2005, pp. 279-286, vol. 174, Elsevier.

PCT, International Search Report and Written Opinion, Jan. 27, 2009, for International Application No. PCT/US2008/059183.

* cited by examiner

Proton density Map

Low Field With Concomitant Gradients

High Field Truncated Concomitant Gradients

Rotating Frame Gradients in Low Field

Proton density Map

Low Field With Concomitant Gradients

High Field Truncated Concomitant Gradients

Rotating Frame Gradients in Low Field

ROTATING-FRAME GRADIENT FIELDS FOR MAGNETIC RESONANCE IMAGING AND NUCLEAR MAGNETIC RESONANCE IN LOW FIELDS

CROSS-REFERENCE TO RELATED APPLICATIONS

This application claims the benefit under 35 U.S.C. 119(e) of U.S. Provisional Application No. 60/909,631, entitled "Rotating Fields for Magnetic Resonance Imaging and Nuclear Magnetic Resonance", filed on Apr. 2, 2007, which is incorporated by reference in its entirety.

STATEMENT REGARDING FEDERAL FUNDING

The present invention was made with U.S. Government support under Contract Number DE-AC02-05CH11231 between the U.S. Department of Energy and The Regents of the University of California for the management and operation of the Lawrence Berkeley National Laboratory. The U.S. Government has certain rights in this invention.

BACKGROUND OF THE INVENTION

1. Field of the Invention

The present invention relates to nuclear magnetic resonance (NMR), and in particular, to Fourier encoding an NMR signal.

2. Description of the Related Technology

Pulsed-field gradient nuclear magnetic resonance (NMR) and magnetic resonance imaging (MRI) tomography rely on Fourier encoding, a method by which the phase of the transverse magnetization is modulated by the application of a gradient in the component of the static field along some direction. The Fourier encoding performed prior to detecting NMR signals introduces spatially dependent phase differences in the NMR signals. To reconstruct the morphology of an object, multiple encodings are collected, and inverse Fourier transformation of the data set provides a map of the local spin density.

At high fields, where a ratio, $\Delta B_{max}/B_0$, of the maximum amplitude $\Delta B_{max}$ of the magnetic gradient field over the field of view or sample volume to the strength $B_0$ of the static magnetic field is much less than 1, the resulting map of spin density is accurate because the spin Hamiltonian, which also contains perpendicular "concomitant" components, is truncated by the strong Zeeman interaction. (Truncation of the Hamiltonian is the averaging of rapidly oscillating concomitant components of the gradient field and is formally equivalent to first-order perturbation theory.) Thus, even though a pure gradient can never be created by Maxwell's equations, truncation makes unidirectional gradients possible in the rotating frame.

At low fields, this picture no longer provides an accurate description of the spin dynamics. As the ratio $\Delta B_{max}/B_0$ is increased, the concomitant fields cause severe distortions in the Fourier encoding and slice selection. When $\Delta B_{max}/B_0$ is 1, for example, planes of isofrequency are bent into spheres whose radius equals one half the field of view. Such distortions in the Fourier encoding can render Fourier encoding impractical in low-field NMR and imaging systems where $\Delta B_{max}$ approaches or even exceeds $B_0$.

SUMMARY OF CERTAIN INVENTIVE ASPECTS

The following detailed description is directed to certain specific embodiments. However, the teachings herein can be applied in a multitude of different ways. The embodiments may be implemented in any system and method that is configured to generate an NMR signal. More particularly, it is contemplated that the embodiments may be implemented in or associated with a variety of NMR applications such as, but not limited to: pulsed-field gradient NMR, magnetic resonance imaging (MRI) tomography, NMR diffusion or velocity measurements, and portable low-field NMR devices for materials and biomedicine.

In one embodiment, there is a method of nuclear magnetic resonance (NMR) detection, the method comprising providing a static magnetic field $B_0$ along a first direction; Fourier encoding nuclear spins in a sample by applying a rotating-frame gradient field $B_G$ superimposed on the $B_0$ field, wherein the $B_0$ field comprises a vector component rotating in a plane perpendicular to the first direction at an angular frequency $\omega$ in a laboratory frame; and detecting a Fourier encoded NMR signal.

In another embodiment, there is a nuclear magnetic resonance (NMR) apparatus comprising a static magnetic field generator configured to generate a static magnetic field $B_0$ along a first direction; first and second sets of gradient coils collectively configured to generate a rotating-frame gradient field $B_G$; superimposed on the $B_0$ field; a current supply module configured to drive a first alternating current in the first set of gradient coils and a second alternating current in the second set of gradient coils, wherein the first and second alternating currents are at least partly out of phase with respect to each other; and a detector configured to detect an NMR signal from a sample placed in the $B_0$ field.

In another embodiment, there is a method of magnetic resonance imaging (MRI), the method comprising providing a static magnetic field $B_0$ along a z unit vector at a sample; selecting a volume for imaging by applying a frequency-selective pulse in the presence of a rotating-frame magnetic field gradient superimposed on the $B_0$ field, wherein the rotating-frame gradient comprises a vector component rotating in a plane perpendicular to the z unit vector; spatially encoding nuclear spins in the selected volume; and detecting a spatially encoded nuclear magnetic resonance signal.

In another embodiment, there a method of performing magnetic resonance imaging (MRI), the method comprising providing a static magnetic field $B_0$; selecting a slice for imaging by applying a frequency-selective pulse in the presence of a first rotating-frame gradient superimposed on the $B_0$ field; performing a plurality of data acquisitions of nuclear magnetic resonance signals from the selected slice, each data acquisition comprising Fourier encoding spins within the slice by applying a second rotating-frame gradient superimposed on the $B_0$ field, detecting a Fourier encoded nuclear magnetic resonance signal, and populating a k-space with the detected nuclear magnetic resonance signal; terminating the data acquisitions when the population of the k-space is completed; performing an inverse Fourier transformation on the populated k-space; and displaying an image indicative of local spin density distribution in the selected slice.

In another embodiment, there is a magnetic resonance imaging (MRI) system comprising means for providing a static magnetic field; means for generating a first rotating-frame gradient and a second rotating-frame gradient; means for generating a selective pulse applied in the presence of the first rotating-frame gradient; means for phase encoding a plurality of MRI signals by the use of the second rotating-frame gradient; means for performing an inverse Fourier transformation on the phase-encoded MRI signals; and means for displaying an image indicative of local spin density distribution in a slice selected by the selective pulse.

BRIEF DESCRIPTION OF THE DRAWINGS

FIG. 5 shows plots (A) in the xz plane with y=0 cm, (B) in the xy plane with z=10 cm, and (C) in the xy plane with z=0 cm of magnetization following a constant gradient pulse ($\Delta B_{max}/B_0 \sim 1.0$) for a Golay pair as used in conventional MRI in.

DETAILED DESCRIPTION OF CERTAIN INVENTIVE EMBODIMENTS

Figure 1:
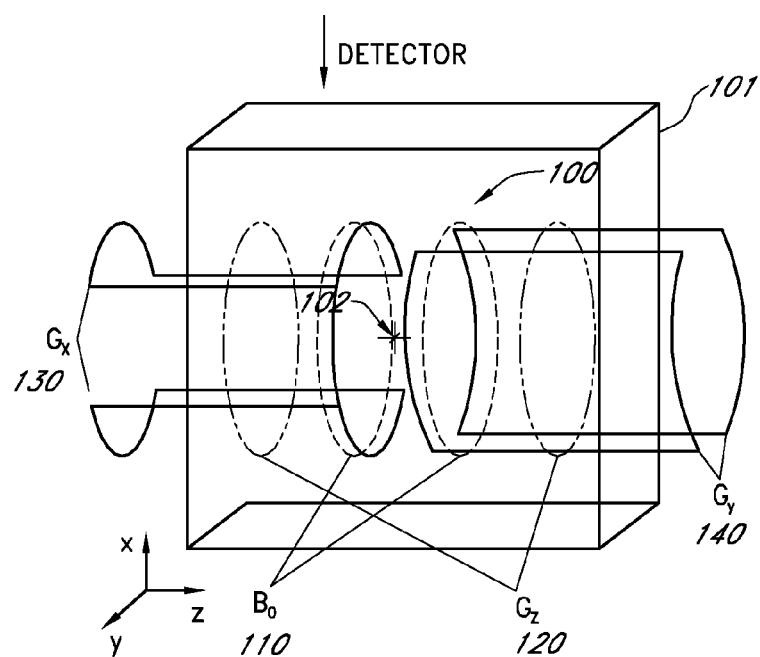
FIG. 1 is schematic showing an embodiment of an NMR system that can be used for generating the static magnetic field $B_0$ and the rotating magnetic field gradient $B_G$.

Certain embodiments provide a method and system for Fourier encoding a nuclear magnetic resonance (NMR) signal. In some embodiments, the Fourier encoding is done in the presence of a low static magnetic field and is tailored to average out concomitant fields present in such low static field regimes. In some embodiments, the Fourier encoding utilizes rotating-frame gradients.

The following detailed description is directed to certain example embodiments of the invention. However, the invention can be embodied in a multitude of different ways as defined and covered by the claims. In this description, reference is made to the drawings wherein like parts are designated with like numerals throughout.

I. Phase Distortions Due to Concomitant Fields a. Averaging Principle

Unidirectional magnetic-field gradients are forbidden by the curl-free and divergence-free conditions on the magnetic field in a region with no currents. However, the electromagnetic forces acting on charged or neutral particles can be tailored for deflecting or trapping purposes using ac fields by exploiting the time average of those fields. In particular, a spin precession in a time-averaged magnetic-field gradient as it applies to the NMR problem of Fourier encoding is discussed below.

The averaging principle for quantum spin systems of Haeberlen and Waugh, also known as Average Hamiltonian Theory, is widely used in the analysis of NMR experiments. The zeroth-order contribution to the Magnus expansion can be given by the time average of the Hamiltonian. Over small time intervals, this zeroth-order description can often be used to describe the evolution for complicated time dependences in the Hamiltonian.

For example, consider a Hamiltonian $H(\tau_f, \tau_s)$ characterized by two widely different time scales: $\tau_f$ and $\tau_s$. $\tau_f$ is the fast scale and $\tau_s$ is the slow scale. Under certain conditions, the time average over the fast scale is sufficient to describe the dynamics of the spin system. Thus, for a Hamiltonian $$H(t) = -\gamma[B_x(t)I_x + B_y(t)I_y + B_z(t)I_z] \quad (1)$$

describing the coupling of a spin I to a magnetic field B, the dynamics in the limit of rapid oscillations are determined by the time average $$H(\tau_s) = -\gamma[\overline{B_x}(\tau_s)I_x + \overline{B_y}(\tau_s)I_y + \overline{B_z}(\tau_s)I_z], \quad (2)$$

where the bar indicates a time average over $\tau_f$. Time averaged magnetic fields can be used to tailor the spatial dependence of spin precession.

b. Interaction Representation

Consider a Hamiltonian $H = -\gamma I \cdot B$ for the interaction of a spin I in a time-dependent magnetic field B, which consists of a constant static component $B(\tilde{r})\hat{z}$, an applied gradient $(r-\tilde{r}) \cdot \nabla B(\tilde{r})$ and an ac field $B_1$. Using the summation convention on i and j indices, the Hamiltonian is $$H(I;B)(r) = -\gamma B(\tilde{r})I_z - \gamma I_i(r_j - \tilde{r}_j)\delta_j B_i(\tilde{r}) - \gamma I \cdot B_1, \quad (3)$$

where $r = (x, y, z)$ and $\tilde{r}$ is the origin. In what follows, $\gamma$ is introduced into the scaling of B so the units of the gradient tensor $\delta_j B_i(\tilde{r})$ are reported in rad/s/cm and the units of B are in rad/s. In the following discussion, abbreviating $\omega_0 = -B(\tilde{r})$, $\omega_1 = -B_1$ and writing $H_G$ and $H_{RF}$ for the parts of the Hamiltonian pertaining to the gradient and rf pulse, respectively, are assumed.

Effecting a transformation to the interaction representation of the Zeeman interaction, $e^{i\omega_0 I_z t}(\cdot)e^{-i\omega_0 I_z t}$, transforms the Hamiltonian to $$H' = e^{i\omega_0 I_z t}[-I_i(r_j - \tilde{r}_j)\delta_j B_i(\tilde{r}) - I \cdot B_1]e^{-i\omega_0 I_z t}. \quad (4)$$

The terms containing $I_z$ are invariant to this rotation transformation while $I_x$ and $I_y$ become time dependent. The components of the applied gradient field in $I_x$ and $I_y$ are called concomitant gradients in the NMR literature. In the limit of high fields, i.e., $$|\omega_0| \gg |(r_j - \tilde{r}_j)\delta_j B_i(\tilde{r})|, \quad (5)$$

they oscillate rapidly and average to zero. This phenomenon is called truncation. Only the terms in $I_z$ affect the spin dynamics at high fields. In low fields, the components in $I_x$ and $I_y$ perturb the motion significantly and must be accounted for. In particular, they may cause geometric phase errors to be discussed later.

For related reasons, only the case of circularly polarized ac fields $$B_1(t)=B_1[\cos(\omega_0 t+\phi)\hat{x}+\sin(\omega_0 t+\phi)\hat{y}], \quad (6)$$

which give rise to a stationary component in the rotating frame about which rotations of the spins can be performed, will be discussed. Linearly polarized ac fields $B_1(t)=B_1 \cos(\omega_0 t)\hat{x}$ give rise to an undesirable time-dependent component which perturbs this motion.

c Magnetic Resonance Imaging (MRI)

In MRI experiments, equilibrium nuclear magnetization proportional to the total longitudinal spin angular momentum operator $$I_z = \sum_{i=1}^{N} I_{z,i}$$

is rotated into a transverse component, e.g., $I_x$, and phase encoded using magnetic-field gradients of the form $I_z(g \cdot r)$, where g is the gradient vector with components $g_i = \delta_i B_z$.

This is because in high fields, static gradient components $\delta_i B_x$ and $\delta_i B_y$ are truncated in the interaction representation, unless ac gradients are used. The quadrature NMR signal measured is proportional to the volume integral of the weighted trace $$F_+(t) = \qquad (7)$$

$$\int d^3 r \, Tr\left[I_+ e^{iI_z \int_0^t g(\tau) \cdot r d\tau} I_x \rho(r) e^{-iI_z \int_0^t g(\tau) \cdot r d\tau}\right] \propto \int d^3 r \rho(r) e^{ik \cdot r},$$

where $k(t) = \int_0^t g(T) dT$ is a wave vector which can be varied using a gradient wave form g(T). The weighting factor $\rho(r)$, also loosely referred to as the "local spin density," is proportional to the total spin angular momentum operator $\Sigma_i I_{z,i}$ contained in a volume element $d^3 r$ and is widely displayed as grayscale intensity in MRI images. Inverse Fourier transformation gives the spin density $\rho(r)$. This principle of Fourier encoding is the basis of MRI.

In low fields, the time-evolution operator is no longer a rotation about $I_z$ of the form $e^{ik \cdot rI_z}$, but corresponds to a rotation about a mixture of axes $I_x$, $I_y$ and $I_z$ due to the presence of oscillating components in $I_x$ and $I_y$. These concomitant components impart a significant phase error to the spins. The phase error is geometric in nature because it corresponds mainly to a tilting of the rotation axis.

It is customary to denote the maximum gradient field over the field of view (FOV) or sample volume, i.e., the quantity $\max_{r \in FOV} \|(r_j - \tilde{r}_j) \cdot \nabla B\|$ by $\Delta B_{max}$. The convention of writing $B_0 = B(\tilde{r})$ and fix the origin $\tilde{r}=0$ at the center of the FOV will be followed. Significant distortions in the Fourier encoding arise when the ratio $\Delta B_{max}/B_0$ is comparable to or greater than one.

II. Rotating-Frame Gradients

In conventional MRI, magnetic-field gradients are typically generated by driving currents in electromagnetic coils designed to create a gradient in the z component of the static field. The pulses are typically dc currents in which the carrier frequency is zero. The contributions to the x and y components of the static field are ignored because of truncation. However, as discussed above, when low fields are used, significant phase distortions are introduced.

One embodiment includes reducing phase distortions by using rotating magnetic field gradients instead of static field gradients. For example, in one embodiment two gradient coils are used, each driven by an ac current at the NMR resonance (Larmor) frequency, with the current in the first coil out of phase with the current in the second coil to generate a rotating-frame gradient that includes a rotating vector component in a plane (e.g., x-y plane) perpendicular to the direction (e.g., z-direction) of the static field $B_0$. The rotating field gradient rotates at an angular frequency $\omega$. In certain embodiments, $\omega$ can be tuned to the Larmor frequency of species to be detected. As will be discussed below, in some embodiments, the gradient coils are disposed and/or AC currents in the coils are driven in such a way that the rotating-frame gradient includes a stationary (time-independent) component ($I_x$, $I_y$, or $I_z$) in the rotating frame. It will be appreciated that a number of rotating-frame gradients may be used to achieve a reduction in phase distortions due to concomitant fields. Two example configurations of the rotating-frame gradients, which are to be used for Fourier encoding, are discussed below.

a. Type I Rotating-Frame Gradients

One type of rotating-frame gradients include gradients that exhibit improved concomitant field averaging than conventional gradients along the z direction (referred to herein as Type I gradients). In certain embodiments of the Type I rotating-frame gradients, a first gradient field of the form $$a(t)(zx+xz) \qquad (8)$$

is added to a second gradient field rotated by 90° about the z axis, with respect to the first gradient field, $$b(t)(zy+yz), \qquad (9)$$

but with the second field driven by a current that is 90° out of phase with respect to the first field, e.g., $$a(t)=g \cos(\omega t+\phi), b(t)=g \sin(\omega t+\phi) \qquad (10)$$

Thus, the two gradient coils are geometrically orthogonal to each other, whereas their currents are phase-orthogonal. The contribution of this gradient field to the interaction representation Hamiltonian is $$H_G^{(I')}(r)=-zg \cos \phi I_x zg \sin \phi I_y + g[x \cos(\omega t+\phi)+y \sin(\omega t+\phi)]I_z. \qquad (11)$$

As used herein, the rotating-frame transformation of the interaction representation refers to the rotation of spin space angular-momentum operators $I_x$, $I_y$, and $I_z$ rather than laboratory frame coordinates (x, y, and z). Taking $\phi=0°$ gives a stationary (time-independent) z gradient field in $I_x$ while $\phi=90°$ gives a stationary z gradient field in $I_y$. The time-dependence of the gradient has been relinquished to an oscillating field along $I_z$. It turns out that this type of Hamiltonian with linearly polarized oscillating components possesses better averaging properties than one with rotating components. As will be discussed below, this type of Hamiltonian performs better Fourier encoding and volume selection along z in low fields. Accordingly, the Type I rotating-frame gradient can play the role of a conventional z-gradient in an NMR setup where $\Delta B_{max}/B_0>0.1$, such as in a low field MRI, with its performance generally exceeding that of a conventional z-gradient.

b. Type II Rotating-Frame Gradients

A second type of rotating-frame gradients includes a class of gradients that exhibit improved concomitant field averaging than conventional gradients along x and/or y directions (referred to herein as Type II gradients). Certain embodiments of the Type II rotating-frame gradients includes a linear superposition of a field with another field $$a(t)(y\hat{x}+x\hat{y}) \quad (12)$$

$$b(t)(-x\hat{x}-y\hat{y}+2z\hat{z}) \quad (13)$$

scaled by $\epsilon$. If these two fields are operated 90° out of phase, their contribution to the interaction representation Hamiltonian is $$H_G^{(II)'}(r) = [-\epsilon xg\sin(\omega t + \varphi) + yg\cos(\omega t + \varphi)] \times \quad (14)$$
$$\left(\frac{I_+e^{i\omega_0 t}+I_-e^{-i\omega_0 t}}{2}\right) + [xg\cos(\omega t+\varphi)-\epsilon yg\sin(\omega t+\varphi)]$$
$$\left(\frac{I_+e^{i\omega_0 t}-I_-e^{-i\omega_0 t}}{2i}\right) + I_z[\epsilon 2zg\sin(\omega t+\varphi)].$$

In the special case $\epsilon=1.0$, this field has the following features. The x gradient Hamiltonian in the rotating frame is time-independent in $I_x$, for $\phi=90°$ or in $I_y$, for $\phi=0°$. They gradient rotates at a rate $2\omega$, while the z gradient oscillates in $I_z$, at rate $\omega$. Such a rotating gradient exhibits better averaging properties along the x direction, and, accordingly, can be used in place of a conventional x-gradient in an NMR setup where $\Delta B_{max}/B_0>0.1$, such as in a low field MRI. Henceforth, this subset of Type II gradients that exhibit better averaging properties primary along the x-direction will be referred to as a Type II x-gradient.

Likewise, stationary y gradients in the rotating frame can be obtained by taking $$a(-y\hat{x}-x\hat{y}) \quad (15)$$

instead of $$a(y\hat{x}+x\hat{y}). \quad (16)$$

or equivalently, by inverting the sign of $\epsilon$. Such a rotating gradient exhibits better averaging properties along the y direction, and, accordingly, can play the role of a conventional y-gradient in an NMR setup where $\Delta B_{max}/B_0>0.1$, such as in a low field MRI, with its performance generally exceeding that of a conventional y-gradient. Henceforth, this subset of Type II gradients that exhibit better averaging properties primary along the y-direction will be referred to as a Type II y-gradient.

c. NMR System

FIG. 1 shows an embodiment of an NMR system 100 that can be used for generating the static magnetic field $B_0$ and the rotating magnetic field gradient $B_G$ described above. It will be appreciated that the following coil description is only one possible configuration and that those of skill in the art will know how to use modern coil design techniques to design alternative configurations. The apparatus 100 includes a static field coil 110, a first gradient coil 120, a second gradient coil 130, and a third gradient coil 140. The cube 101 is included for the purpose of explaining the geometry of the setup. For a low field NMR experiment, e.g., a low-field prepolarization NMR, the static measurement field $B_0$ can be generated by a Helmholtz pair 110 arranged in the center of the cube 101. For a higher-field NMR experiments, the static measurement field $B_0$ can be generated by a superconducting solenoid magnet. Alternative embodiments include the use of permanent magnets for generating $B_0$. In still another embodiment, $B_0$ is provided by the Earth's magnetic field. In still another embodiment, hyperpolarized gases such as Xe gas is used, instead of a static magnetic field, to polarize spins. In certain embodiments, the first gradient coil 120 is a z gradient Maxwell pair disposed along the z direction configured to generate a gradient field generally having a gradient along z; and the second and third gradient coils 130, 140 are x and y gradient Golay coils 130 and 140 configured to generate gradient fields generally having a gradient along x and y, respectively. It must be noted that FIG. 1 shows only left and right part of the x and y gradient Golay coils, respectively, for ease of illustration.

In certain embodiments, the NMR system 100 includes a detector (not shown) that is disposed with respect to the static field and gradient coils to detect a precessing magnetization $M_P$. In some of those embodiments, the detector includes an induction coil that is responsive to a change of flux due to the precessing magnetization $M_P$. In other embodiments, the detector can include a magnetometer, e.g., a Superconducting Quantum Interference Device (SQUID) or a laser magnetometer that can directly measure the magnetization flux itself. In yet other embodiments, the signal detection can be performed in a region that is different from the excitation region can be used. For example, in some embodiments, after Fourier encoding using the gradient coils, the spins in the sample (e.g., a fluid sample) are stored using a suitable storage pulse and then transported to a remote detector.

The NMR system 100 can also include an excitation coil (not shown) that generates soft and/or hard pulses for exciting the spins in the sample. As used herein, a "soft" pulse refers to an AC excitation pulse with relatively narrow frequency bandwidth covering Larmor frequencies of spins in a desired volume or slice such that the soft pulse only affects (rotates or nutates) those spins within the desired volume. On the other hand, a "hard" pulse refers to an AC excitation pulse with a relatively wide frequency bandwidth that covers Larmor frequencies of all spins within and outside the desired volume such that it excites substantially all of the spins in the sample.

To produce the Type I rotating-frame gradient described by Eqs (8), (9), and (10), for example, Type I gradient coils comprising the x-gradient Golay coil 130 and the y-gradient Golay coil 140 can be used. For example, the gradient coil 130 can be driven with an AC current that is 90° out of phase from an AC current driving the gradient coil 140 in order to generate a Type I rotating-frame gradient. To produce the Type II rotating-frame gradient described by Eqs (12) and (13), Type II gradient coils comprising the z-gradient Maxwell pair 120 and a vertical Golay coil (not shown) can be used. The vertical Golay coil can be thought of as the x-gradient Golay coil 130 or the y-gradient Golay coil 140 that has been rotated 90° about the y-axis onto the x-axis. In certain embodiment, the NMR system 100 includes only Type I gradient coils. In other embodiments, the NMR system 100 includes only Type II gradient coils. In yet other embodiments, the NMR system 100 includes both Type I and Type II gradient coils. It will be apparent to one skilled in the art that particular types and arrangements of gradient coils described above represent only few of many possible ways to generate Type I or Type II rotating-frame gradient fields. For example, the Type I and Type II gradients can be realized with many different types of gradient coils other than the Maxwell pair and the Golay coils described above. In fact, in certain embodiments, neither the Maxwell pair nor the Golay coil is used; instead, linear programming and target field methods or other optimization methods are used to design gradient coils.

As used herein, terms such as "z gradient Maxwell pair" and "x and y gradient Golay coils" are used for ease of identification with the corresponding conventional gradient coils. However, those terms should not be interpreted literally in this rotating-frame gradient framework. For example, in certain embodiments, the z gradient Maxell pair 120 can be used as part of Type II gradient coils to produce a rotating-frame gradient field that can be used in place of conventional x and/or y gradient fields in low fields as described above in Section II(c). Similarly, x and y Golay coils 130, 140 are used as Type I coils to produce a rotating-frame gradient field that can be used in place of conventional z gradient field in low fields as described above in Section II(b).

In order to generate a rotating-frame gradient $B_G$, that rotates about the z-axis, the system of coils 100 also includes a current supply module (not shown) that drives two sets of alternating currents into two gradient coils, where the two sets of alternating currents are at least partly out of phase with respect to each other. In certain embodiments, the two sets of alternating currents include sinusoidal currents of angular frequency $\omega$ that are 90° out of phase with respect to each other such as $i_1(t)=i_a \cos(\omega t+\phi)$ and $I_2(t)=i_b \sin(\omega t+\phi)$, where $i_a$ and $i_b$ are the magnitudes of the sinusoidal currents $i_1$ and $i_2$, respectively, $\omega$ is the angular frequency, and $\omega$ is an initial phase angle. In some embodiments, in generating Type II rotating-gradients, the current magnitudes, $i_a$ and $i_b$, can be scaled relative to another to scale the $\epsilon$ factor discussed above with reference to Eq. 14. In certain embodiments, the angular frequency $\omega$ is exactly tuned to the Lamor frequency of the chemical species, e.g., $^1$H or $^{13}$C, within the desired detection volume.

As discussed above, the Type I gradient coils can be used to generate a rotating-frame gradient that exhibits better averaging properties than a conventional z gradient, at least in a low field ($\Delta B_{max}/B_0 > 0.1$) regime, along the z direction. Similarly, the Type II gradient coils can be used to generate the Type II x gradients and the Type II y gradients that exhibits better averaging properties than conventional x and y gradients, at least in a low field ($\Delta B_{max}/B_0 > 0.1$) regime, along x and y directions, respectively. For example, in the embodiments where the NMR system 100 includes both Type I and Type II sets of coils, rotating-frame gradients that provide better averaging properties in all three (x, y, z) directions than the conventional x, y, z gradients in a low field ($\Delta B_{max}/B_0 > 0.1$) regime can be produced.

Various embodiments employ different values or different ranges of values of the $\Delta B_{max}/B_0$ ratio. The $\Delta B_{max}/B_0$ ratio can be selected by choosing a combination of $\Delta B_{max}$ and $B_0$ values, which is determined, in certain embodiments, by geometry of and current(s) flowing in the gradient coils and the static field coil, respectively. In certain embodiments, the ratio is greater than 0.1. In other embodiments, the ratio is greater than 0.5. In yet other embodiments, the ratio is between 0.5 and 1.0. In yet other embodiments, the ratio is between 1.0 and 3.0. In yet other embodiments, the ratio is between 3.0 and 10. In other embodiments, the ratio is between 10 and 25. In yet other embodiments, the ratio is greater than 25. The strength of the static magnetic filed, $B_0$, can range from several µT to several T. The rotating-gradient field scheme is especially useful in a low field, e.g., $B_0$ less than 100 mT. The choice of $B_0$ may be limited due to practical considerations, because it is difficult to or costly to generate a strong magnetic field. The question, then, becomes for a given $B_0$, how high a $\Delta B_{max}$ (or the gradient amplitude) can be used without introducing distortions in the encoding. The $\Delta B_{max}/B_0$ ratio dictates some limit on the gradient amplitude that can be used. If the gradient amplitude is too week, the Fourier encoding can take an excessive amount of time. If the gradient pulses are too long, e.g., on the order of $T_2$ (transverse relaxation time) or longer, there is going to be a loss of signal due to $T_2$ decay and, perhaps, also diffusion losses because spins will have enough time to diffuse large enough distances. On the other hand, if strong enough gradients can be chosen, several steps of Fourier encoding can be done in a short time (short compared to $T_2$), so more data points can be acquired to form an image, the imaging time will be faster, and also signal loss can be mitigated.

Some embodiments include driver electronics and control hardware for energizing the coils and generating the magnetic field gradients. Such hardware is well known to those of skill in the art. Some embodiments include a detection coil positioned within the magnetic field gradient coils. In some embodiments, driver electronics and control hardware are provided for driving the detection coil to generate radiofrequency pulses and for using the detection coil to detect free induction decay of a sample within the coil.

Some embodiments include computer processors and algorithms for control and processing the NMR system. Such a processor and algorithms can, for example, among other things, control slice selection and k-space data acquisition sequences, perform inverse Fourier transformations, and display spin density maps, as discussed below.

d. Averaging Properties of the Rotating-Frame Gradients

Now the averaging properties of rotating-frame gradients are compared versus conventional gradients. Their performance can be quantified by a phase error, which corresponds to the difference between the intended phase imparted by a stationary magnetic field gradient and the actual phase obtained in the presence of time-dependent concomitant components. For a magnetic moment M processing about a magnetic field B, $$\frac{dM}{dt} = M \times B \tag{17}$$

and it is possible to define a phase angle in the plane perpendicular to B if the motion of B is slow enough. This example of Berry's phase for a classical spin has been treated classically using Hannay's angle.

Let B=Bb while (I, $\phi$) are canonical action-angle variables on the sphere $S^2$ with I=M·b and (r) is the angle in the ($e_1$, $e_2$) plane that is perpendicular to the unit vector b. The two-form $$dI \wedge d\phi = -S \sin\theta d\theta \wedge d\phi \tag{18}$$

is proportional to the area element on $S^2$ and defines a symplectic form on $S^2$. The Hamiltonian in action-angle variables has the form H(I;B)=BI, where B plays the role of the external parameter. At the end of a slow cycle in B, the magnetic moment M is back on its circle of precession at t=1 and its position is shifted by $$\varphi(1) - \varphi(0) = \int_0^1 B(t)\,dt - \frac{\partial}{\partial I}\oint \langle p\,d_B q\rangle, \tag{19}$$

where p: $=M_z$ and q: $=\arctan[M_y/M_x]$, $d_B$ denotes the exterior derivative in the parameter space of the Hamiltonian and $$\langle p\,d_B q\rangle = \frac{1}{2\pi}\int_0^{2\pi} p(\varphi, I; B)\,d_B q(\varphi, I; B)\,d\varphi \tag{20}$$

is the torus average, which arises in the adiabatic limit. In this adiabatic limit, the geometric angle equals $$-\frac{\partial}{\partial I}\oint \langle p d_B q \rangle = \Omega(C), \quad (21)$$

where $\Omega(C)$ is the solid angle subtended by the closed curve C on the parameter manifold B=const. When the adiabaticity is relaxed, it is still possible to define a geometric phase if the precession, which begins perpendicular to the effective field, remains mostly perpendicular to it during the motion, however, the geometric phase deviates from the above solid angle formula.

Consider the following two closed curves where t varies from 0 to 1 s. The arc trajectory, $$B_A(t) = \hat{y}B_1 \sin\alpha \sin(2\pi t) + \hat{z}B_1 \sqrt{1 - [\sin\alpha\sin(2\pi t)]^2}. \quad (22)$$

begins parallel to $\hat{z}$ (t=0), then tilts by an angle $\alpha$ toward $-\hat{y}$, then toward $+\hat{y}$, and back to $\hat{z}$ (t=0). The maximum angular rate of rotation for $B_A$ about the $\hat{x}$ axis is $\sin(\alpha)2\pi$ rad/s, which gives 0.63 rad/s for $\alpha$=0.1 rad and 1.25 rad/s for $\alpha$=0.2 rad.

The circular trajectory $$B_C(t) = \hat{x}B_1 \sin\alpha \cos(2\pi t) + \hat{y}B_1 \sin\alpha \cos(2\pi t) + \hat{z}B_1 \cos\alpha, \quad (23)$$

where $\alpha$ is the spherical polar angle measured from the $\hat{z}$ axis. The motion of $B_C$ is circular about the $\hat{z}$ axis with angular velocity $2\pi$ rad/s.

The above rates of change ($2\pi$, 0.63, and 1.25 rad/s) are to be compared with the rate of precession of the magnetization vector about the effective field $B_1$=10 rad/s and 20 rad/s. Except for the case $2\pi$ rad/s, these cyclic trajectories are adiabatic.

Table I shows numerical calculations of the geometric phase obtained by evolving the initial condition M=$\hat{x}$ over one period where t ranges from 0 to 1. During the trajectory, the total phase $\phi_{tot}=\phi(1)-\phi(0)$ is calculated as the total angle traced by the magnetization vector M(t), including all windings, as the magnetization nutates about the $\hat{z}$ axis while mostly remaining near the xy plane. A conventional gradient behaves like the $B_C(t)$ trajectory whereas the quadrature rotating-frame gradient behaves as $B_A(t)$. In the case of quadrature rotating-frame gradients the relative phase errors, as quantified by the f parameter, are considerably lower.

TABLE I

The parameter f = 100% × [($\phi_{tot}$ − $\phi_{dyn}$)/$\phi_{dyn}$] gives the percentage geometric phase relative to the dynamical phase. The solid angle of the motion is $\Omega(\alpha) = \int d\Omega = \int_0^{2\pi}\int_1^{\cos\alpha} d(\cos\theta)d\phi$.

| Trajectory | α (rad) | $B_1$ (rad/s) | $\phi_{tot}$ (rad) | $\phi_{dyn}$ (rad) | f (%) | $\phi_{tot} - \phi_{dyn}$ (rad) | $\Omega(\alpha)$ (sr.) |
|---|---|---|---|---|---|---|---|
| $B_A$ | 0.1 | 10.0 | 9.89 | 9.87 | 0.2 | 0.02 | 0 |
|  | 0.1 | 20.0 | 19.75 | 19.75 | 0.02 | 0.005 | 0 |
|  | 0.2 | 10.0 | 9.98 | 9.87 | 1.1 | 0.11 | 0 |
|  | 0.2 | 20.0 | 19.77 | 19.75 | 0.1 | 0.02 | 0 |
| $B_C$ | 0.1 | 10.0 | 10.03 | 9.87 | 1.6 | 0.16 | 0.0314 |
|  | 0.1 | 20.0 | 19.78 | 19.77 | 0.05 | 0.01 | 0.0314 |
|  | 0.2 | 10.0 | 10.56 | 9.87 | 7.0 | 0.69 | 0.1252 |
|  | 0.2 | 20.0 | 19.86 | 19.75 | 0.6 | 0.11 | 0.1252 |

Figure 2A:
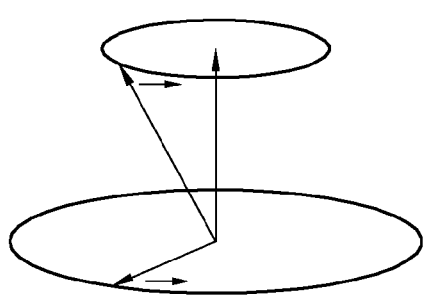
FIG. 2 is a vector representation illustrating Hamiltonian cycles for the case of a conventional imaging gradient (A) versus a Type I rotating-frame gradients (B) where $\Delta B_{max}/B_0 \sim 1$.
Figure 2B:
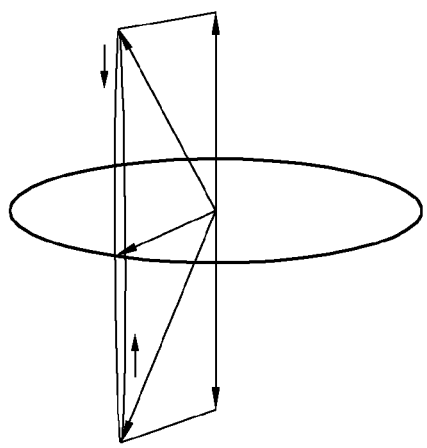

FIG. 2 illustrates Hamiltonian cycles for the case of a conventional imaging gradient (A) versus a Type I rotating-frame gradients (B) where $\Delta B_{max}/B_0 \sim 1$. As discussed above with respect to Eq. 21, in the adiabatic limit, the geometric phase distortion or deviation introduced by the concomitant components is proportional to the solid angle suspended by the closed curve C. The most obvious difference between the Hamilton cycles of (A) and (B) is the respective suspended solid angles during the motion. As shown in FIG. 2, the conventional imaging gradient produces a large solid angle which translates to a large geometric phase distortion, whereas a rotating-frame gradient, e.g., the Type II rotating-frame gradient, produces a zero solid angle which translates to no geometric phase distortion. While the Hamiltonian cycles illustrated in FIG. 2 is valid only in the adiabatic limit, a condition which is sometimes violated in regions that are too far from the center of the field of view, it is nevertheless useful to illustrate the general averaging, hence, distortion-reducing, properties of the rotating-frame gradients.

III. Fourier Encoding a. Fourier Encoding with Rotating-Frame Gradients

Figure 3:
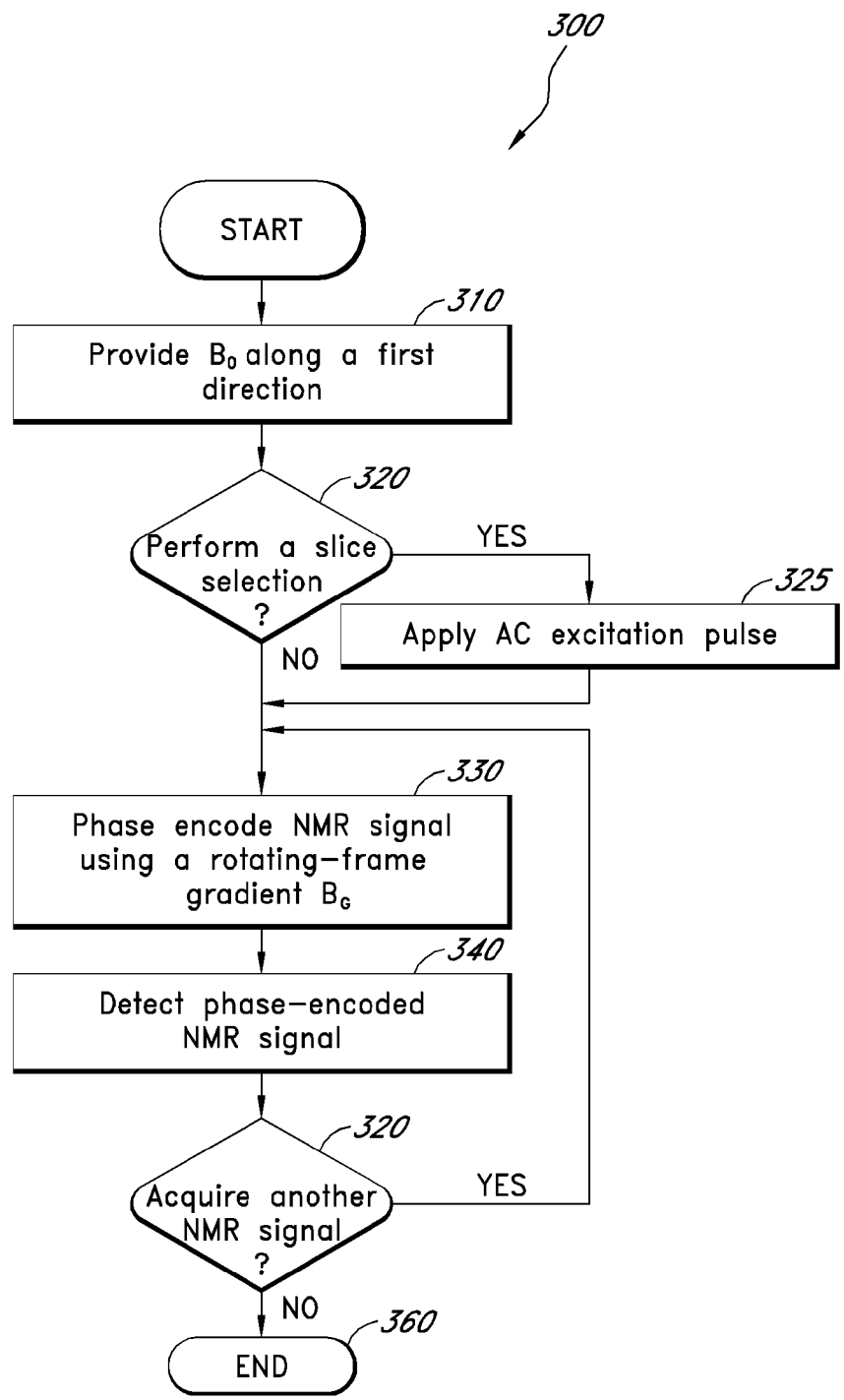
FIG. 3 is a flowchart illustrating an example process for generating and detecting a Fourier encoded NMR signal using rotating-frame gradients according to certain embodiments.

FIG. 3 is a flowchart that illustrates an example process 300 for generating and detecting a Fourier encoded NMR signal using rotating-frame gradients according to certain embodiments. Depending on the particular embodiment, steps may be added to those depicted in the flowcharts herein or some steps may be removed. In addition, the order of steps may be rearranged depending on the application. The process 300 starts at a state 310, where a static magnetic field $B_0$ is provided along a first direction, e.g., z direction. Such static magnetic field can be generated by a Helmholtz pair 110 such as the one illustrated in FIG. 1 or a solenoid electromagnet. In order to produce detectable NMR signals, spins in the sample need to be first polarized. Such polarization can be done in many different ways including: 1) applying a sufficiently strong static magnetic field $B_0$; 2) applying pre-polarization field $B_P$ for a period of time and turning it off; 3) using hyperpolarized gases such as Xe gas. The process 300 proceeds to a decision state 320, where it is determined whether a volume selection, e.g., 2-dimensional slice selection, is to be performed. The slice selection using rotating-frame gradients will be discussed in detail with respect to FIGS. 8-10 below. If a volume selection is to be performed, the process 300 moves to a state 325, where one or more AC excitation pulses for selecting a volume are applied in presence of a gradient to rotate the spins from its state-steady direction (e.g., $I_z$) into another direction (e.g., $I_y$) in the rotating frame. The transverse magnetization which has been excited outside the selected slice may be eliminated by applying spoiler (or crusher) gradient pulse, if desired.

After the AC excitation pulse(s) is applied (or if slice selection is not performed), the process moves to a state 330, where an NMR signal generated by spins in the sample are phase encoded by the use of rotating-frame gradients such as the Type I and/or Type II rotating-frame gradients discussed above. The choice of the rotating-frame gradients used for the Fourier encoding depends in part on the geometry of the volume being imaged. The choice of the rotating-frame gradients in the MRI context will be discussed in detail below with respect to FIG. 8 below. If no volume selection is to be performed at the decision state 320, the process 300 proceeds directly to the state 330. For example, this case may be used where the Fourier encoding is performed in 3-dimensions rather than 2-dimensions as in the case of a slice selection. In both cases, the process 300 proceeds to a state 340, where the Fourier encoded NMR signal is detected by the use of a detector. As explained in Section II(c) above, the detector can be an induction coil or a magnetometer. In certain embodiments, a remote detection method, in which, after Fourier encoding using the gradient coils, the spins in the sample (e.g., a fluid sample) are stored using a suitable storage pulse and then transported to a remote detector, where the Fourier encoded magnetization is read out. The process 300 proceeds to a decision state 350, where it is inquired whether to acquire another NMR signal. In a typical MRI system, multiple NMR signals for different stages of Fourier encoding may be acquired to populate a "k-space." If the answer is YES, the process 300 loops back to the state 330 and the state 340 for additional Fourier encoding and signal detection. This iterative process continues until all of the k-space is populated. This iterative acquisition process will be described in detail in Section IV below. If the answer to the decision state 350 is NO, the process 300 ends at state 350.

b. Numerical Simulations

To compare the Fourier encoding based on rotating-frame gradients to Fourier encoding based on conventional DC gradients widely used for MRI, numerical calculations of the magnetization evolution under time-independent DC gradients and quadrature rotating-frame gradients were performed. Rotations induced by rotating-frame gradients take place about the $I_y$ axis. Therefore, the magnetization is nutated primarily in the xz plane. For conventional DC gradients, magnetization is modulated about $I_z$ so that nutations would be expected to take place in the xy plane. Deviations to this expected behavior are due to nonsecular gradient components.

The numerical calculations were performed on a Pentium IV machine using FORTRAN 90 code compiled using version 8.1 of the Intel Fortran compiler for Linux. The density operator is propagated from initial to final states, using at least 100 subdivisions of the time axis per oscillation period of the rotating frame to calculate the time-ordered product of matrix exponentials $$U(T_C) = \Pi_{i=1}^{100} \exp(-iH_i dt) \quad (18)$$

to approximate the propagator, where H, is a step-function approximation to H'(t). The only calculations involved are time evolutions under the rotating-frame gradient Hamiltonian for a given amount of time.

Figure 4A:
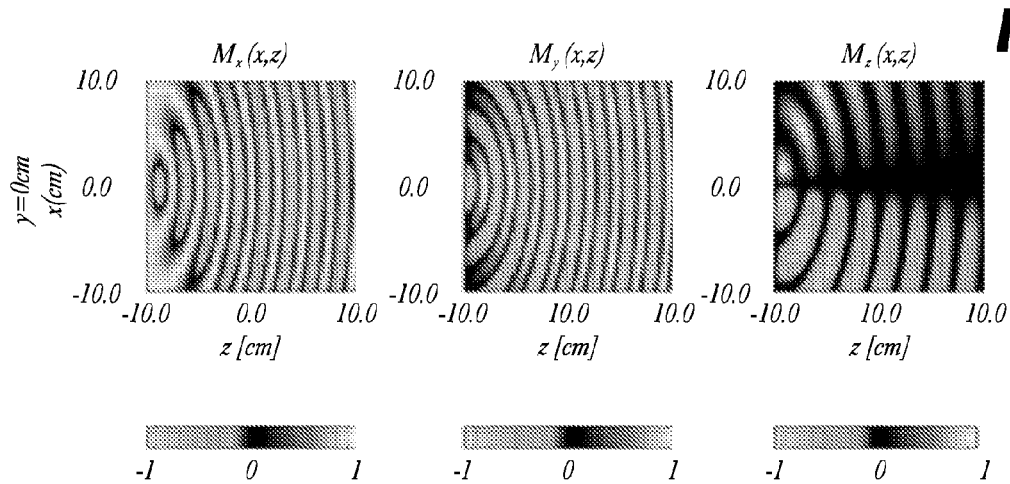
FIG. 4 shows plots in the xz plane with (A) y=0 cm, (B) y=0.5 cm, and (C) y=10 cm illustrating the effects of concomitant gradient fields on Fourier encoding with a Maxwell coil with field $g(x\hat{x}+y\hat{y}-2z\hat{z})$ and $\Delta B_{max}/B_0 \sim 1.0$.
Figure 4B:
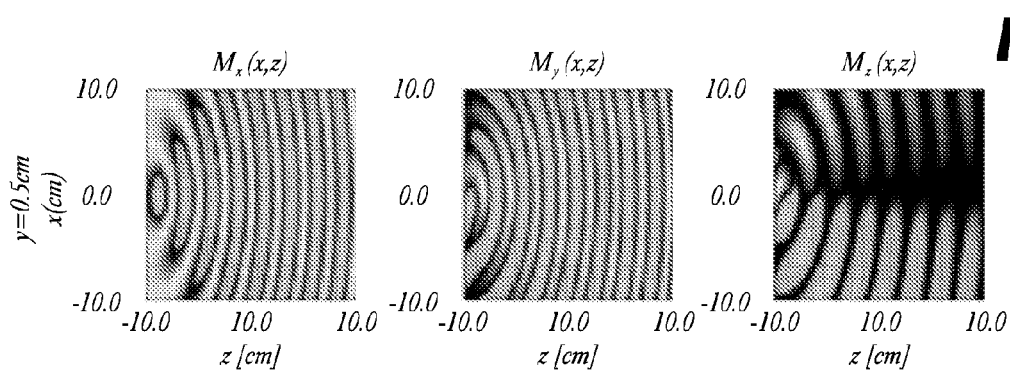
Figure 4C:
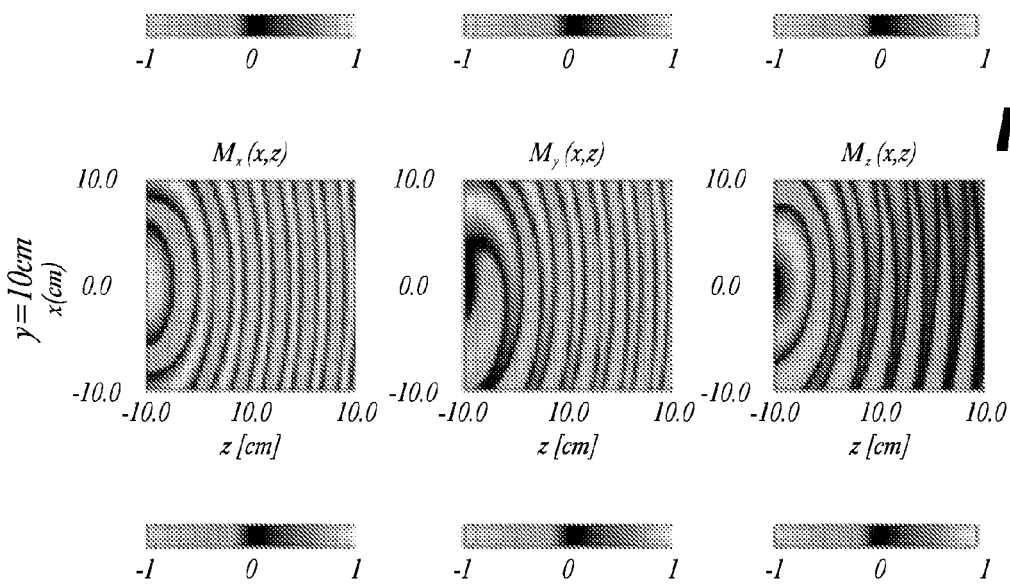

FIG. 4 illustrates the effects of concomitant gradient fields on Fourier encoding for a Maxwell coil with field $g(x\hat{x}+y\hat{y}-2z\hat{z})$ and $\Delta B_{max}/B_0 \sim 1.0$. The intent is to produce a modulation along z. Instead of a linear phase dependence along z, the modulation depends on x because of deviations caused by the nonsecular concomitant fields. Here, $\Delta B_{max}=gFOV/2$, where FOV=20 cm is the field of view. The distortions in the spatial encoding also depend on y, as can be seen by comparing FIG. 4(A) to FIGS. 4(B) and 4(C), which are plots of the magnetization following a constant gradient pulse applied for 40 μs for y=0 cm, 0.5 cm, and 10 cm, respectively. The corresponding results for the magnetization plots in yz planes identical to the xz planes are due to the symmetry of this gradient. This renders the conventional gradient useless when the ratio $\Delta B_{max}/B_0$ is large.

Figure 5A:
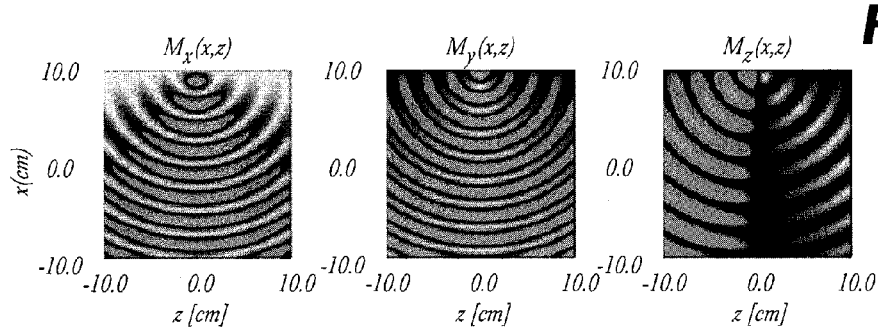
Figure 5B:
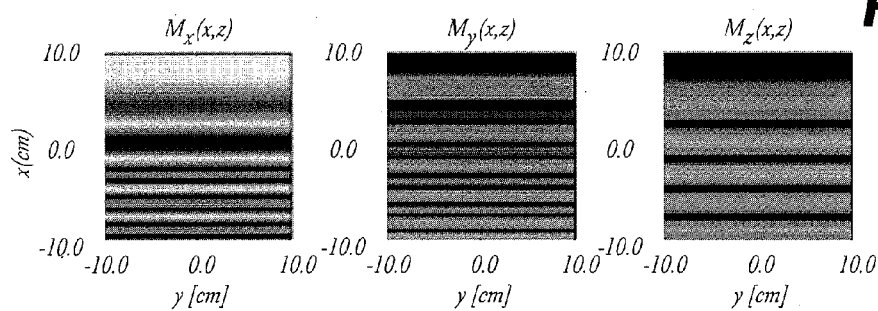
Figure 5C:
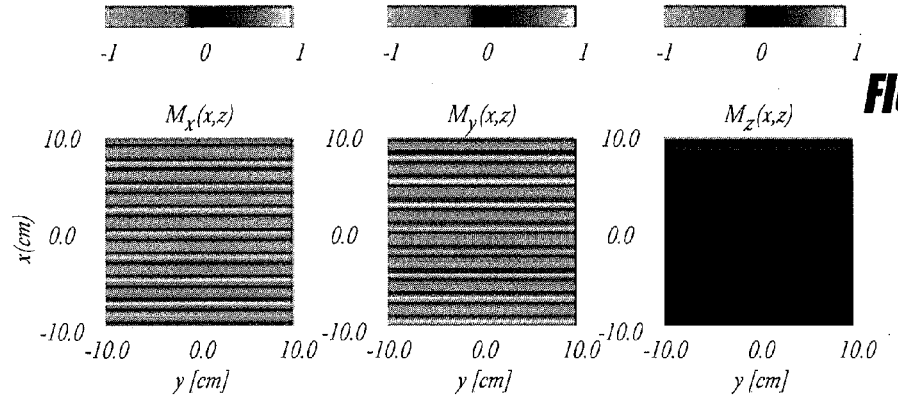

FIG. 5 shows similar plots of magnetization following a constant gradient pulse $(\Delta B_{max}/B_0 \sim 1.0)$, for a Golay pair as used in conventional MRI. Such coils are normally used to provide modulations along x and y. The total field is $g(z\hat{x}+x\hat{z})$ and includes a concomitant component along z. This component is responsible for the heavy distortions in the modulation profile. FIG. 5(A) shows the greatest distortions in the xz (y=0 cm) plane. The least distortion is seen in the plot of magnetization along xy, as shown in FIG. 5(C), for the plane z=0 cm. However, distortions increase with z, as seen in FIG. 5(B) for the case z=10 cm. The encoding was produced by applying a 62,872 rad/s/cm gradient in a 628,716 rad/s static field for 40 μs.

In both cases of Maxwell or Golay pair coils, a similar behavior is observed in which curved surfaces converging towards a common attractor whose location, according to Yablonskiy, is a focal point for these concentric surfaces and the radius of curvature is $R_c = B_0/g$.

Figure 6A:
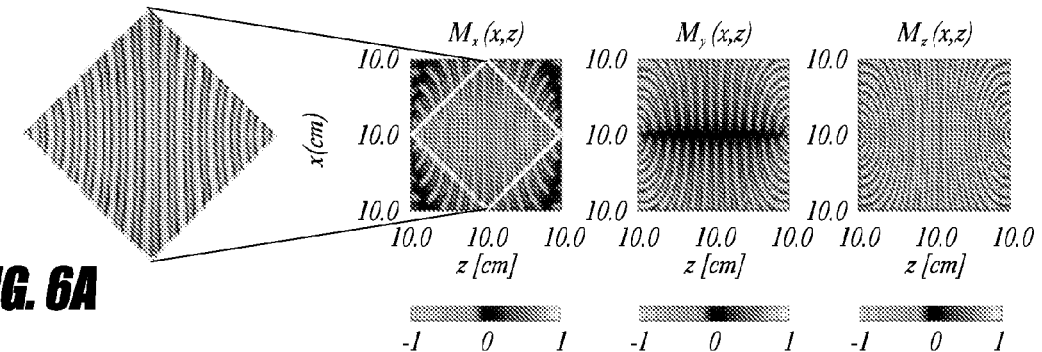
FIG. 6 shows plots of the magnetization profile in a 20 cm field of view following 40 μs of evolution in a quadrature rotating-frame gradient for which $\Delta B_{max}/B_0 \sim 1.0$ using (A) a type I rotating frame gradient, (B) a type II x rotating frame gradient, and (C) a type II y rotating frame gradient.
Figure 6B:
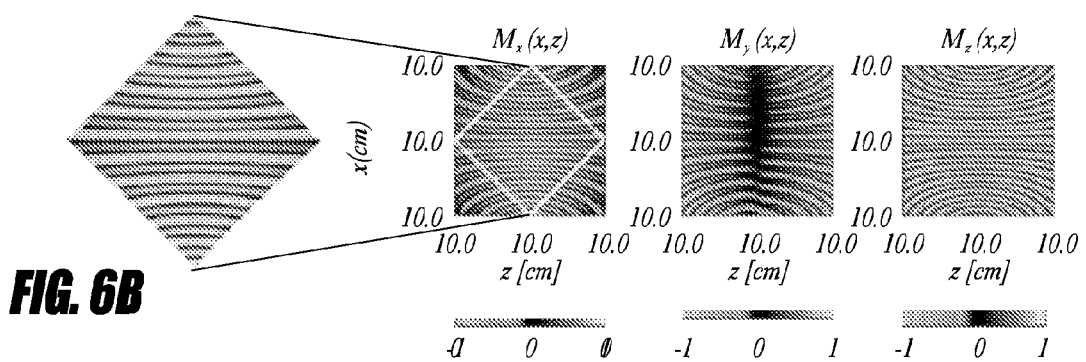
Figure 6C:
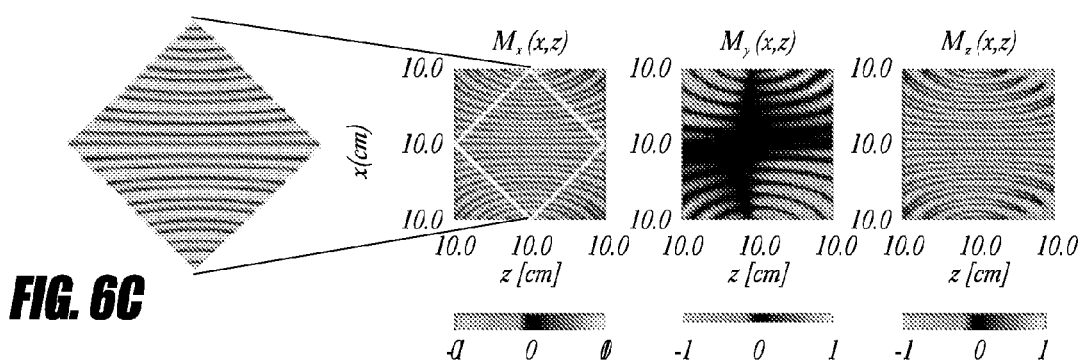

FIG. 6 depicts plots of the magnetization profile in a 20 cm field of view following 40 μs of evolution in a quadrature rotating-frame gradient for which $\Delta B_{max}/B_0 \sim 1.0$. The encoding was produced by applying a 62,872 rad/s/cm gradient in a 628,716 rad/s static field for 40 μs. FIG. 6(A) shows a z modulation produced using a Type I rotating-frame gradient which is to be compared with the pattern of FIG. 4(A). The single focal point is split in two opposite attractor points, resulting in lower overall curvature of the phase profile. The smaller phase errors are due to the smaller solid angle traced by the Hamiltonian trajectory.

If a square region is cut out of this magnetization profile at 45° to the field of view (FIG. 6), the modulation is close to ideal, with displacements of the isofrequency sets along the direction of curvature less than 5% of the length of the corresponding isofrequency segment. The area of this reduced field of view is $1/\sqrt{2}$ the original field of view; this is equivalent to undistorted Fourier encoding with $\Delta B_{max}/B_0 \sim 0.7$.

To realize Fourier encoding of MRI slices in the xz and yz plane, this type of gradient presents a substantial improvement for imaging under conditions of strong gradient fields, i.e., when $\Delta B_{max}/B_0 > 0.1$, over conventional static gradients. A simulated MRI image is shown in the next section which documents the improved spatial encoding.

Rotating frame Type II gradients also provide improved spatial encoding in the case of magnetization modulations along x and y within an xz or yz slice, respectively. The results in FIGS. 6(B) and 6(C) were produced with a scaling factor $\epsilon=0.5$. This choice of c reduces the impact of the oscillating concomitant component along $I_z$, which is responsible for much of the distortion in the encoding. This comes at the price of a slight oscillatory perturbation in the static concomitant component of the gradient along $I_y$; however, results show that this error is tolerable. Again, this improved performance can be understood in terms of geometric phase, with the exception of a rotating 2ω term in the transverse plane. However, this component is small in the neighborhood of y=0.

As for the case of a conventional static gradient, the magnetization profile degrades further as the plane is moved away from the origin (data not shown). However, for the purposes of Fourier encoding a slice whose thickness is 1 cm, the profile is sufficiently constant across the slice thickness when $\Delta B_{max}/B_0 \sim 1.0$.

c. Imaging Performance Comparison

Distortions in the Fourier encoding ultimately translate into image distortions. In the limit |k|→0, there are no significant distortions to the Fourier encoding simply because there is no evolution under the gradient fields. Distortions from concomitant gradients increase with spatial frequency. To illustrate image distortion effects the Fourier encoding process is simulated in FIG. 7.

Figure 7C:
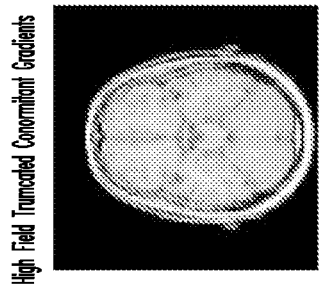
FIG. 7 shows simulations of proton density maps for a Cartesian grid phantom illustrating (A) the actual phantom, (B) the resulting image under high field, (E) the resulting image under low field with conventional gradients, and (F) the resulting image under low field with rotating frame gradients; and proton density maps for an axial slice of human brain illustrating (C) the actual slice, (D) the resulting image under high field, (G) the resulting image under low field with conventional gradients, and (H) the resulting image under low field with rotating frame gradients.
Figure 7G:
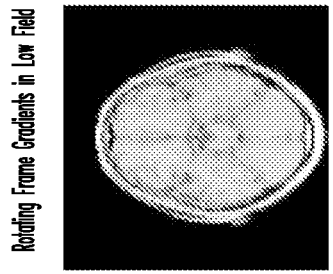
Figure 7D:
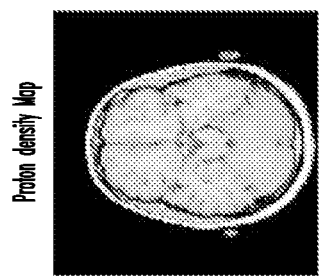
Figure 7H:
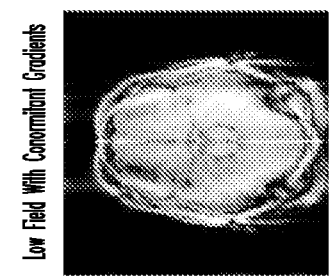
Figure 7A:
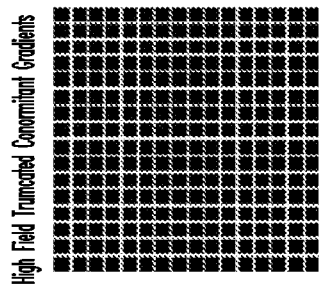
Figure 7E:
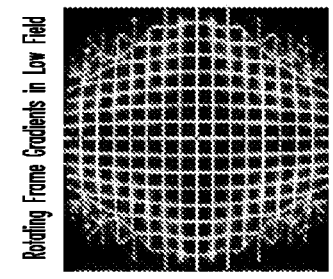
Figure 7B:
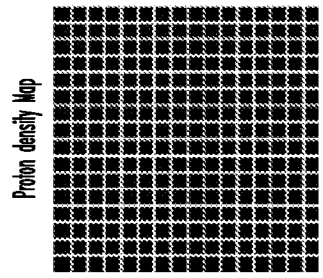
Figure 7F:
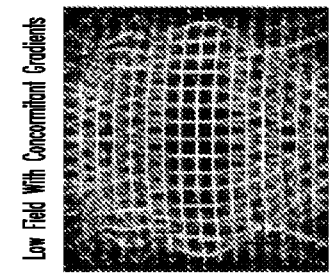

A 128×128 single shot echo-planar imaging (EPI) readout, i.e., where k space is acquired continuously in a raster fashion on a rectangular grid of size 128×128, is applied to the 128×128 proton density maps of FIG. 7(A) (a Cartesian grid phantom) and 7(C) (an axial slice of human brain). Conventional high-field MRI images [FIGS. 7(B) and 7(D)] faithfully represent the respective proton density maps while acquisition in low field [FIGS. 7(E) and 7(G)] suffers from heavy distortions, ghosting and blurring over most of the field of view $(\Delta B_{max}/B_0 \sim 3.2$ at 10 cm from the center). Most of these artifacts are absent over the middle $1/\sqrt{2}$ region of the field of view in the case of quadrature rotating-frame gradient encoding [FIGS. 7(F) and 7(H)]. Gradient strength was 26,741 rad/s/cm and the field strength was 85,120 rad/s.

IV. Volume Selection in Magnetic Resonance Imaging

Volume selection refers to the excitation or de-excitation of nuclear spins only within a desired volume. Conventional volume selection is done by applying pulses in the presence of static gradient fields. For example, selection of 2-D slices is traditionally performed by applying soft pulses in the presence of a static magnetic field gradient along the z axis. In the presence of concomitant gradients, conventional methods are easily rendered useless. It is now explained how the averaging principle can be used to combine conventional soft pulses with hard pulses and rotating-frame gradients to avoid such distortions.

a. Slice Selection Using Rotating-Frame Gradients

Figure 8:
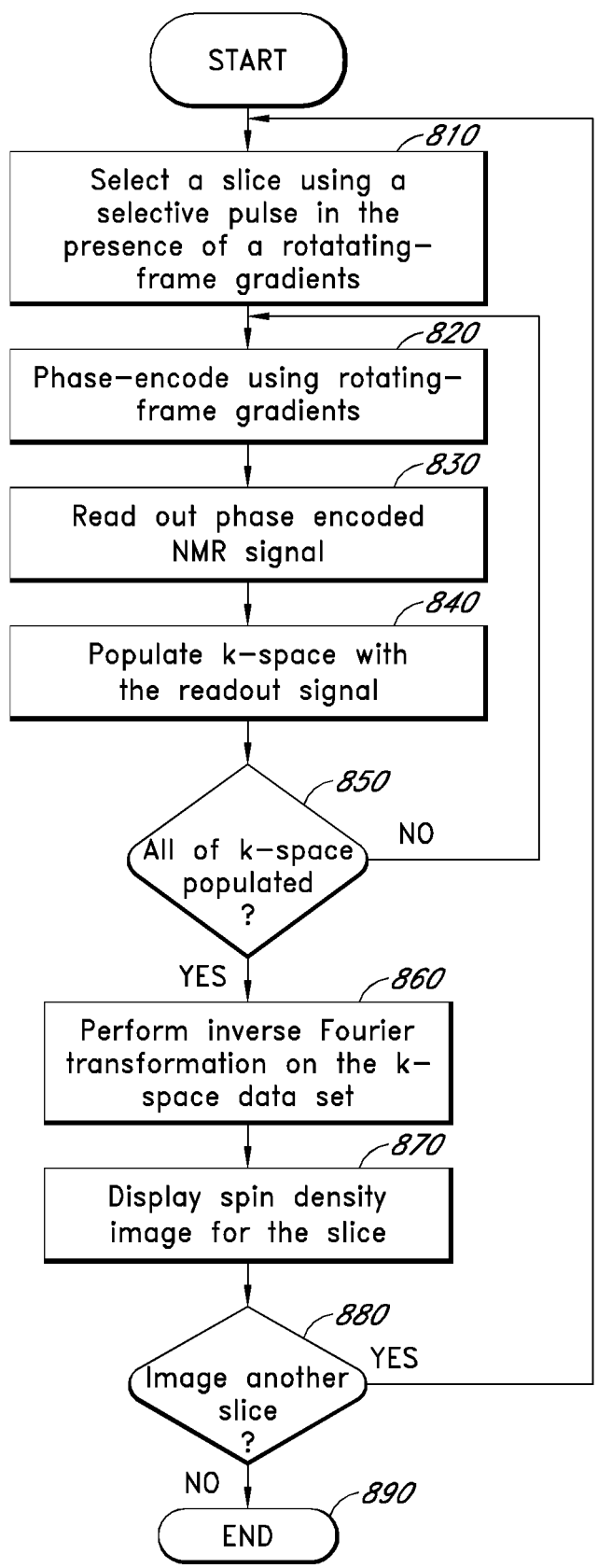
FIG. 8 shows a flowchart illustrating an example process for selecting slices and Fourier encoding using rotating-frame gradients for MRI.

FIG. 8 shows a flowchart illustrating an example process 800 for selecting slices and Fourier encoding using rotating-frame gradients for MRI according to certain embodiments. The process 800 starts at a state 810, where a slice to be imaged is selected by an application of a selective pulse in the presence of a selection rotating-frame gradient. Some embodiments include two different kinds of slice selection schemes. In the first kind, only those spins within a desired slice are excited using a soft pulse, leaving all spins outside the slice unexcited. In the second kind, all spins in the sample are excited using a hard pulse, both within and outside the slice, and only those spins within the desired slice are de-excited using a soft pulse. The selective pulse includes a soft pulse having a center frequency corresponding to the magnetic field seen by spins at the center of the slice and a frequency bandwidth corresponding to a desired width of the slice. Here, the selective pulse is assumed to be an ac field polarized along $I_x$. The choice of the selection rotating-frame gradient depends, at least in part, on the type of the slice being imaged. For example, to image an axial slice, a Type I rotating-frame gradient whose Hamiltonian, $H_G^{(I)'}$ [Eq. (11)], can be made to provide a z gradient along $I_y$, such as the one described by Eqs. (8), (9), and (10), can be used. To image a sagittal or coronal slice, a Type II gradient [Eq. (14)], which can be used to produce a stationary x or y gradient along $I_y$, in the rotating frame, can be used. For example, to image a sagittal slice, a Type II y gradient, such as the one described by Eqs. (12) and (13), can be used. Similarly, to image a coronal slice, a Type II x gradient, such as the one described by Eqs. (15) and (16), can be used. Those of skill in the art will appreciate many possible pulses and pulse sequences that can be used for slice selection. One possible pulse sequence for slice selection is described below in Section IV(c).

Once a slice is selected, the MRI signal is subject to spatial encoding. The process 800 proceeds to a state 820, where an MRI signal from the selected slice is Fourier encoded using one or more Fourier encoding rotating frame gradients. In MRI context, the choice of Fourier encoding gradient depends on the type of MRI slice selected in the state 810. For an axial slice, the Fourier encoding in the x-y plane can be performed by the use of the Type II x and y gradients described in Section II(b) above. For a sagittal slice, the Fourier encoding in the x-z plane can be performed by the use of the Type I gradient and Type II x gradient described in Sections II(a) and II(b) above, respectively. Similarly, for a coronal slice, the Fourier encoding in the y-z plane can be performed by the use of a Type I gradient and a Type II y gradient described in Sections II(a) and II(b) above, respectively.

After the spatial encoding is performed on the MRI signal, the process 800 proceeds to a state 830, where the Fourier encoded MRI signal is detected or read out via a detector such as an induction coil or a magnetometer. Prior to detection, the rotating-frame gradients are switched off, such as by using a rapid switching circuit. For example, Q-switching may be employed. The process then proceeds to a state 840, where a k-space is populated with the readout MRI signal. As used herein, the term "k-space" refers to a data set comprising MRI signals readout at different acquisition cycles with varying degrees of Fourier encoding. In case of a 2-dimensional MRI involving a selected slice in the z direction, the k-space can be defined by two dimensional $k_x$ and $k_y$ axes. In the case of a 3-dimentional MRI, the k-space can be defined by three dimensional kx, ky, and $k_z$ axes. The following discussion will be limited to the 2-dimensional MRI involving a selected slice. In a Fourier imaging method, $k_x$ and $k_y$ represent time axes for a fixed gradient amplitude. In a spin-warp method, $k_x$ and $k_y$ represent gradient amplitudes for a fixed Fourier encoding interval. Once the readout signal is stored in the k-space, the process 800 proceeds to a decision state 850, where it is determined whether the k-space is fully populated, e.g., whether all $(k_x, k_y)$ elements have been stored with MRI signal values acquired at different acquisition cycles. If the answer is no (k-space not fully populated), the process 800 loops back to the state 820, where another acquisition cycle begins. The acquisition cycle comprising the states 820, 830, and 840 repeats until the k-space is fully populated. At the subsequent acquisition cycle, the phase encoding rotating-frame gradient is varied to acquire a different region of k-space. The variation may include a different amplitude of gradient or a different time of application of the gradient. Various methods regarding the order in which the k-space is populated (known a trajectory in the k-space) exist in the art and apply similarly to the acquisitions involving rotating-frame gradients discussed herein.

If the answer to the decisional state 850 is yes (k-space fully populated), the process continues to a state 860, an inverse Fourier transform is performed on the data set representing the k-space. The inverse Fourier transformation converts the k-space data set to a spin density data set representing spin density in image space. The process 800 proceeds to a state 870, where the spin density data set is used to create an image for the slice displayed, e.g., on a computer screen. The process 800 proceeds to another decision state 880, where it is determined whether there is need to image another slice. If the answer is yes, the process loops back to the state 810 and another slice selection, followed by another set of acquisition cycles to populate a new k-space, begins. If the answer is no (no need to image another slice), the process 800 ends at state 890.

b. An Example Quadrature Acquisition

Figure 9:
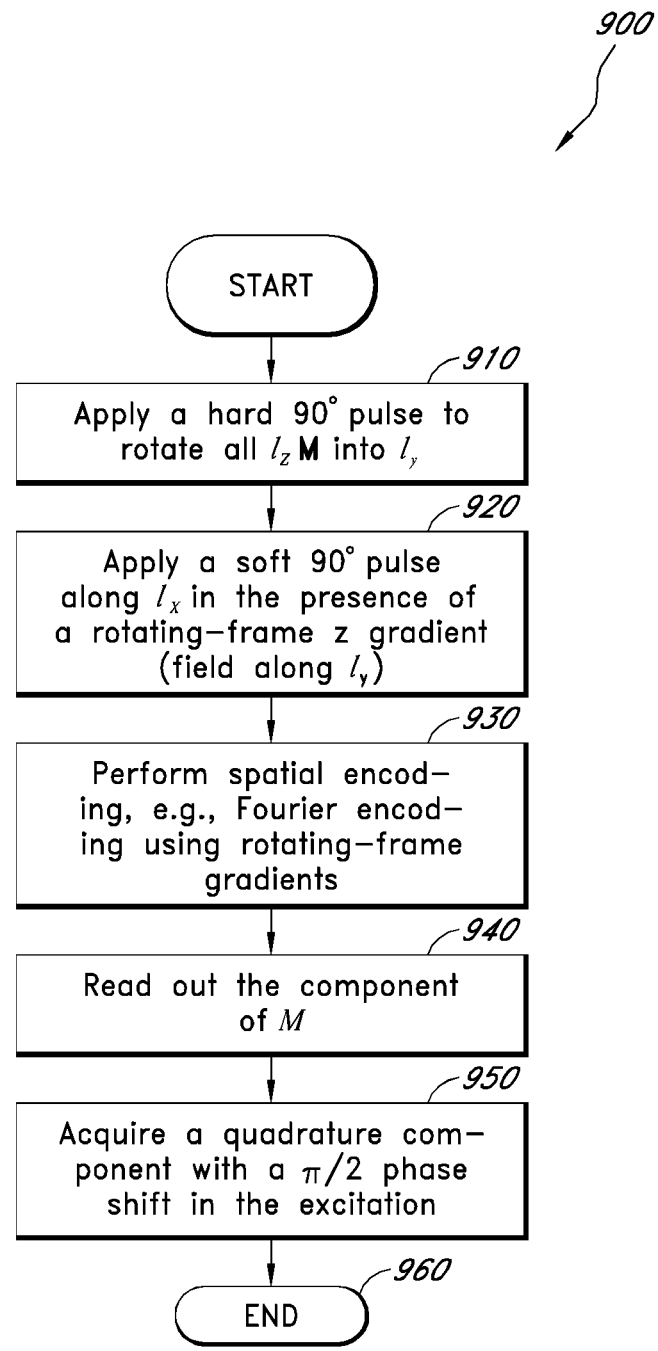
FIG. 9 shows a flowchart illustrating an example process for acquiring a quadrature k-space sample.

FIG. 9 shows a flowchart illustrating an example process 900 for acquiring a quadrature k-space sample. The process 900 starts at a state 910, where a 90° hard (wide-band) pulse is first used to rotate all $I_z$ magnetization into $I_y$. The process 900 then proceeds to a state 920, where a selective pulse comprising a soft (narrow-band) 90° pulse is applied along $I_x$ in the presence of a z gradient whose field is along $I_y$, e.g., a term $g_2zI_y$, in the Hamiltonian [Eq. (11)]. The process 900 then proceeds to a state 930, where with the excited spins along $-I_z$, a spatial encoding, e.g., Fourier encoding, is performed with a rotating-frame gradient. The MRI signal is contained in the x and z components of the magnetization. The process 900 proceeds to a state 940, where the x (in-phase) component of the magnetization is read out. This scheme permits a further subsequent encoding of this magnetization. The process 900 optionally proceeds to a state 920, where a quadrature or out-of-phase (y) component of the magnetization is acquired with a π/2 shift in the excitation.

The π/2 shift can be introduced by a subsequent hard pulse or a soft pulse. It will be appreciated that other embodiments could use many alternative methods, e.g., phase shifting of the pulses, for obtaining quadrature detection.

c. An Example Selective Pulse

Now, a particular embodiment of the selective pulse comprising a soft pulse intermittently interrupted by a fast train of coherent hard pulses at regular intervals is described. Such a pulse is described by a Hamiltonian with two time scales $(H_{RF}+H_G)'(T_s, T_f)$, where $T_s$ is the slow time scale of modulations in the soft pulse envelope and $T_f$ is the rapid scale of the hard pulse cycle. Averaging over one period removes the dependence on the fast scale, giving an effective Hamiltonian $\overline{(H_{RF}+H_G)'}(T_s)$. Consider the following two cases.

In the zero static field case, $H'_G=gzI_x+gxI_z$ and $H'_{RF}=\omega_1(t)I_y$. Therefore, $$\overline{(H_{RF}+H_G)'}=\omega_1(t)I_y+gzI_x \quad (24)$$

for a soft pulse $\omega_1(t)$, which contains the coherent pulse train of Eq. (A2) designed to remove $I_z$. In the low field case with a Type I gradient, $H_G^{(I)'}$ is given by Eq. (11) with $\phi=0°$, so that $$\overline{(H_{RF}+H_G^{(I)})'}=zgI_x+\omega_1(t)t_y+\overline{g[x\cos(\omega t)+y\sin(\omega t)]}I_z. \quad (25)$$

If $2\pi/\omega$ is large compared to the repetition period of the hard pulse train, the time-dependent term is nearly constant from the perspective of the coherent pulse train and the $I_z$ term vanishes. In the other limit, the time-dependent terms oscillate rapidly and their effect is minimal. This is the case of truncation at high field.

Figure 10:
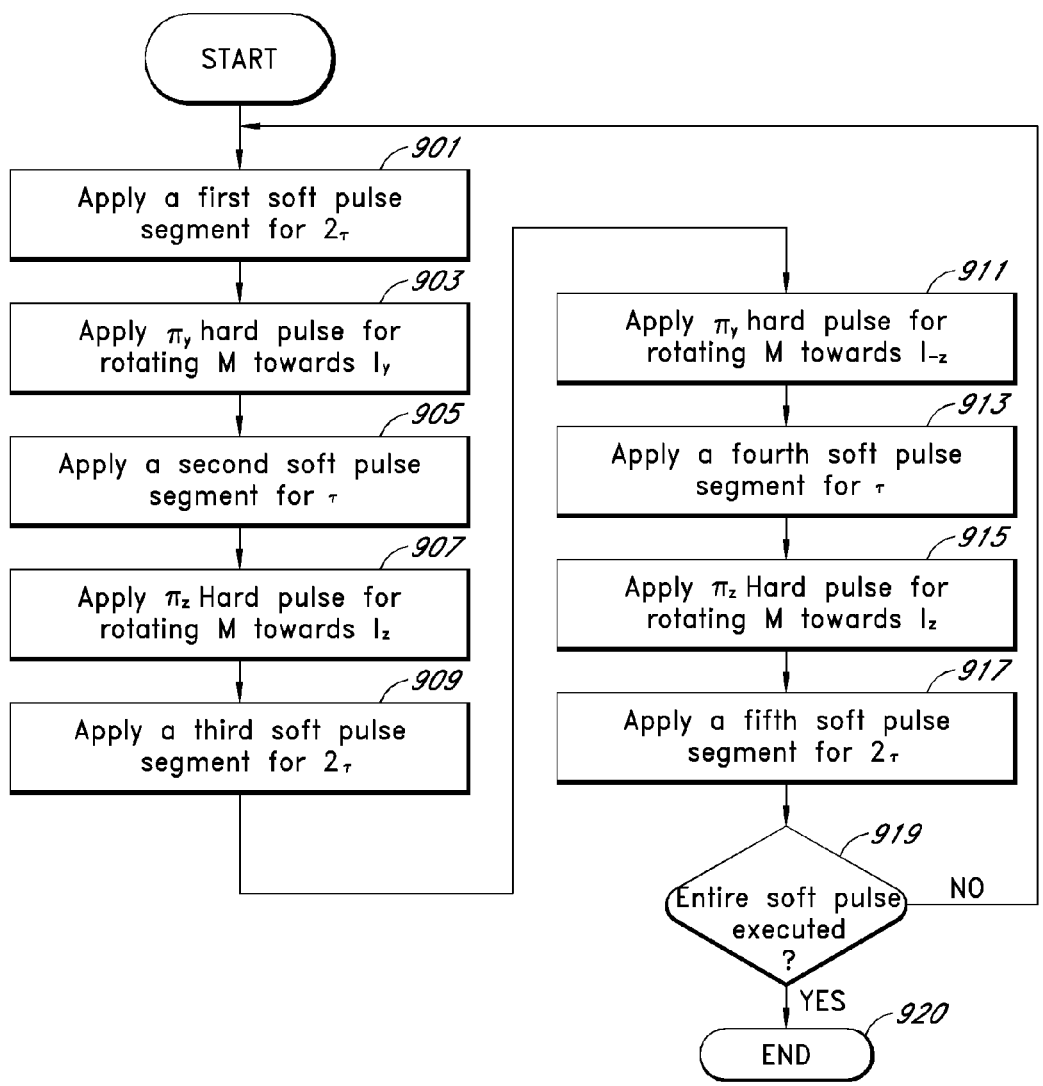
FIG. 10 shows a flowchart illustrating an example process for generating selective pulses designed to average out $I_z$ term to zero during its course.

FIG. 10 shows a flowchart illustrating an example process 1000 for generating selective pulses designed to average out $I_z$ term to zero during its course. Consider a soft pulse such as the Geen & Freeman wave form. To produce a selective pulse which averages out the $I_z$ term to zero during its course, the soft pulse is modified by inserting the following coherent train of hard pulses:

$$\{2\tau-(\pi_y)-\tau-(\pi_z)-2\tau-(\pi_{-z})-\tau-(\pi_{-y})-2\tau\}_n, \quad (26)$$

where $\tau$ and $2\tau$ delays indicate intervals within which small segments of the soft pulse are applied. The pulse described by Eq. 26 and illustrated by FIG. 10 represents the $n^{th}$ cycle in repetitive applications of selective pulses. The cycle is repeated until the entire soft pulse is executed. Each selective pulse comprises five soft pulse segments: a first soft pulse segment, a second soft pulse segment, a third soft pulse segment, a fourth soft pulse segment, and a fifth soft pulse segment. As described with respect to FIG. 8 (state 810) above, the selective pulse is applied in the presence of a selection rotating-frame gradient. The process 900 starts at a state 901, where the first soft pulse segment is applied for a time duration $2\tau$. The process proceeds to a state 903, where the first soft pulse segment is interrupted by a $\pi_y$ hard pulse. The $\pi_y$ hard pulse excites and rotates substantially all spins in the sample towards the $I_y$ component in the rotating frame. The process 900 proceeds to a state 905, where a second soft pulse segment is applied for $\tau$. The process proceeds to a state 907, where the second soft pulse segment is interrupted by a $\pi_z$ hard pulse rotating substantially all spins in the sample towards the $I_z$ component in the rotating frame. The process proceeds to a state 909, where a third soft pulse segment is applied for $2\tau$. The process proceeds to a state 911, where the third soft pulse segment is interrupted by a $\pi_{-z}$ rotating substantially all spins in the sample towards the $I_{-z}$. The process proceeds to a state 913, where a fourth soft pulse segment is applied for $\tau$. The process proceeds to a state 911, where the fourth soft pulse segment is interrupted by a $\pi_z$ rotating substantially all spins in the sample towards the $I_z$. The process proceeds to a state 913, where a fifth soft pulse segment is applied for $2\tau$. It was found that $\tau$ should be roughly three orders of magnitude less than the total pulse during for the averaging to be effective. The exact figure depends on the shape of the soft pulse with smoother shapes generally less demanding of the coherent train. The new pulse will be slightly longer. Its length increases by the total duration of the hard pulses added. This produces a pulse with two widely different time scales over which one may average out the fast scale. In certain embodiments, the rotating-frame gradient is turned off during the intermittent train of hard pulses. In other embodiments, the rotating-frame gradient can be left on during the intermittent train of hard pulses, especially, where the bandwidth of the hard pulses is wide enough to cover the whole frequency spread introduced by the gradient.

d. Imaging Performance Comparison

Figures 11A, 11B, 11C:
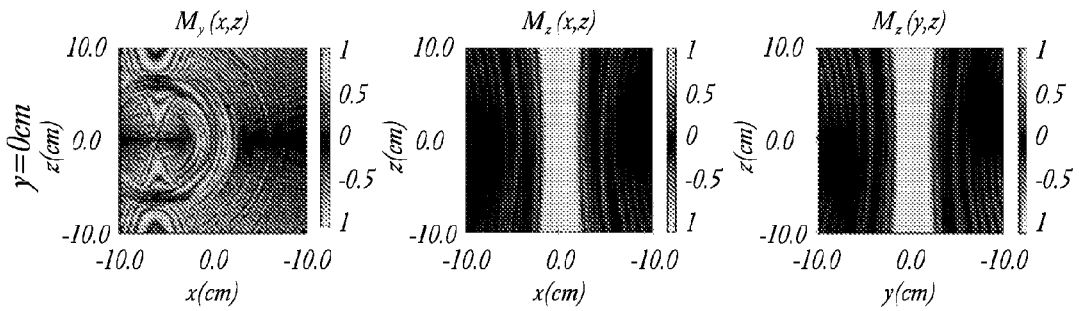
FIG. 11 shows plots of slice-selection profiles for a saddle-pair gradient along x for xy planes at (A) y=0 cm and (D) y=−10 cm, x slice selection using type II x rotating frame gradients for xy planes at (B) y=0 cm and (E) y=−10 cm, y slice selection using type II y rotating frame gradients for xy planes at (C) y=0 cm and (F) y=−10 cm, z slice selection using a conventional Maxwell coil at (G) y=−10 cm and (H) y=0 cm, and z slice selection using type I rotating frame gradients at (I) y=−10 cm and (J) y=0 cm.
Figures 11D, 11E, 11F:
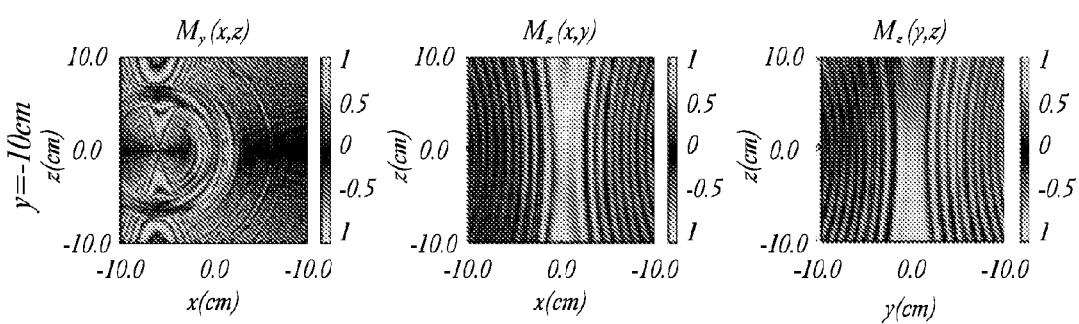

For strong concomitant gradients ($\Delta B_{max}/B_0>1.6$), conventional MRI slice selection schemes are incapable of producing slices without a severe amount of distortion, as seen in FIGS. 11(A) and 11(D). The slice profile, which should be rectangular, is heavily distorted into a spherical shell with significant amounts of excitation occurring outside the intended slice. FIGS. 11(B) and 11(C) illustrate slice selection on axis (y=0 cm) along x or y using a Type II rotating-frame gradient with $\epsilon=1.0$. While the performance is slightly degraded when going off axis (|y|=10 cm), as seen in FIGS. 11(E) and 11(F), the degradation is far less important than the conventional case of FIGS. 11(A) and 11(D), and such distortions are only significant near the edges (|y|>8 cm) of the volume. The pulse duration was 10 ms with 79 subunits per pulse. The gradient was 1605 rad/s/cm with a static field of 10,080 rad/s. One cycle lasted 623 μs with 16 cycles across the pulse duration.

Figures 11G, 11H:
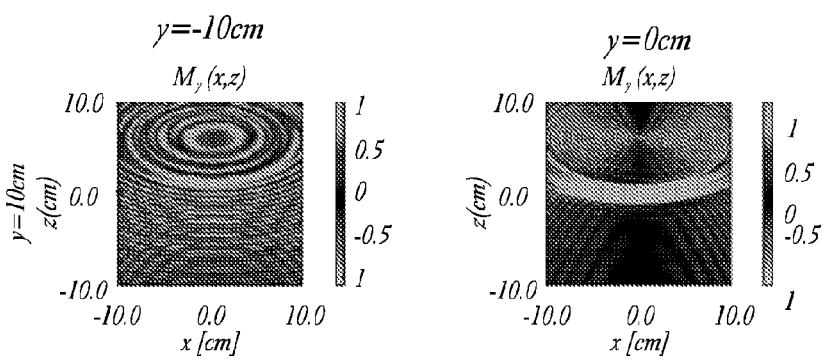
Figures 11I, 11J:
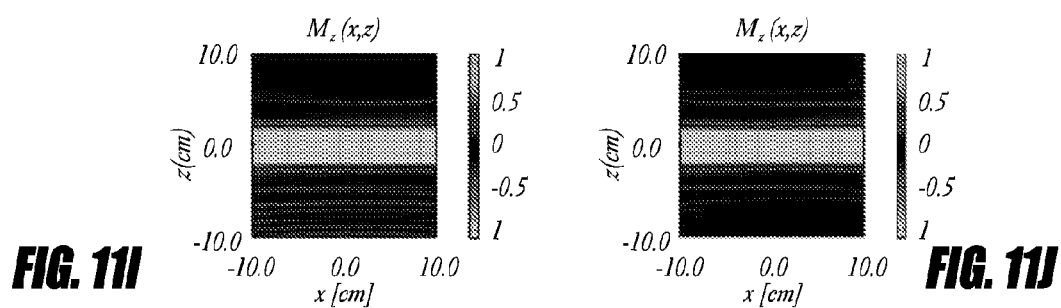

The case of conventional slice selection with an applied z gradient from a Maxwell coil ($\Delta B_{max}/B_0\sim1.6$) is shown in FIGS. 11(G) and 11(H). Although the performance is slightly better than a Golay pair generating an orthogonal slice on axis [compare FIGS. 11(H) and 11(A)], the slice profile suffers from a heavy elliptical curvature and strong contamination originating from outside the intended volume. It is clear that conventional MRI gradient encoding performs poor slice selection in the regime $\Delta B_{max}/B_0\sim1.6$. In contrast, a Type I rotating-frame gradient provides clean slice selection both on and off axis, as seen in FIGS. 11(I) and 11(J). It was found that this Type I gradient performs equally well in the asymptotic regime $\Delta B_{max}/B_0\sim25$ (data not shown).

CONCLUSION

While the above detailed description has shown, described, and pointed out the fundamental novel features of the invention as applied to various embodiments, it will be understood that various omissions and substitutions and changes in the form and details of the system illustrated may be made by those skilled in the art, without departing from the intent of the invention.

What is claimed is:

1. A method of nuclear magnetic resonance (NMR) detection, the method comprising:
   a) pre-polarizing a sample by:
      applying a prepolarization field $B_p$ for a period of time, and
      switching the prepolarization field off;
   b) providing a static magnetic field $B_0$ along a first direction;
   c) after switching the prepolarization field off, Fourier encoding nuclear spins in the sample by applying a rotating-frame gradient field $B_G$ superimposed on the $B_0$ field, wherein the $B_G$ field comprises a vector component rotating in a plane perpendicular to the first direction at an angular frequency ω in a laboratory frame; and d) detecting a Fourier encoded NMR signal.

2. The method of claim 1, wherein the $B_0$ field is inhomogeneous.

3. The method of claim 2, wherein the degree of inhomogeneity of the inhomogeneous $B_0$ field is greater than 1 part in 100 over a field of view or imaging volume.

4. The method of claim 1, wherein the angular frequency w is about at the Larmor frequency of the encoded spins.

5. The method of claim 1, wherein the rotating-frame gradient field $B_G$ comprises a circularly polarized field.

6. The method of claim 5, wherein the circularly polarized field comprises a superposition of two linearly polarized time-varying fields that are phase-orthogonal to each other.

7. The method of claim 1, wherein the rotating-frame gradient field $B_G$ produces a time-independent component in a rotating frame.

8. The method of claim 1, wherein the rotating-frame gradient field $B_G$ comprises a time-independent z gradient along a transverse direction in a rotating frame.

9. The method of claim 1, wherein the rotating-frame gradient field $B_G$ comprises a time-independent x gradient along a transverse direction in a rotating frame.

10. The method of claim 1, wherein the rotating-frame gradient field $B_G$ comprises a time-independent y gradient along a transverse direction in a rotating frame.

11. The method of claim 1, wherein the rotating-frame gradient $B_G$ is substantially in the form of $a(t)(zx+xz)+b(t)(zy+yz)$, where:

$$a(t)=g\cos(\omega t+\phi);$$

$$b(t)=g\sin(\omega t+\phi);$$

z is a unit vector along the first direction;
x is a unit vector in a laboratory frame that is perpendicular to z;
y is a unit vector in the laboratory frame that is perpendicular to both z and x;
ϕ is an initial phase angle; and
g is a gradient amplitude.

12. The method of claim 1, wherein the rotating-frame gradient $B_G$ is substantially in the form of $a(t)(yx+xy)+\epsilon b(t)(-xx-yy+2zz)$, where:

$$a(t)=g\cos(\omega t+\phi);$$

$$b(t)=g\sin(\omega t+\phi);$$

z is a unit vector along the first direction;
x is a unit vector in a laboratory frame that is perpendicular to z;
y is a unit vector in the laboratory frame that is perpendicular to both z and x;
ϵ is a scaling factor that can range from −1 to 1;
ϕ is an initial phase angle; and
g is a gradient amplitude.

13. The method of claim 1, comprising using the NMR signal for magnetic resonance imaging (MRI) measurement.

14. The method of claim 1, comprising using the NMR signal for high resolution NMR spectroscopy measurement.

15. The method of claim 1, comprising using the NMR signal for a gradient diffusion measurement.

16. The method of claim 1, wherein a ratio $(\Delta B_{max}/B_0)$ of the maximum amplitude $\Delta B_{max}$ of the rotating magnetic gradient field $B_G$ over a sample volume to the strength $B_0$ of the static magnetic field $B_0$ is greater than 0.1.

17. The method of claim 16, wherein the ratio $\Delta B_{max}/B_0$ is greater than 25.

18. The method of claim 1, wherein the $B_P$ field is applied while the $B_0$ field is applied.

19. The method of claim 1, wherein the $B_P$ field is switched off before the $B_0$ field is applied.

20. The method of claim 1, wherein the $B_G$ field is switched off prior to detecting the NMR signal.

21. A nuclear magnetic resonance (NMR) apparatus comprising:
a pre-polarization magnetic field generator configured to apply a pre-polarization magnetic field $B_P$;
a switch configured to turn off the pre-polarization magnetic field generator;
a static magnetic field generator configured to generate a static magnetic field $B_0$ along a first direction;
first and second sets of gradient coils collectively configured to generate a rotating-frame gradient field $B_G$ superimposed on the $B_0$ field;
a current supply module configured to drive a first alternating current in the first set of gradient coils and a second alternating current in the second set of gradient coils, wherein the first and second alternating currents are at least partly out of phase with respect to each other;
a detector configured to detect an NMR signal from a sample placed in the $B_0$ field;
a switch configured to stop current flowing through the first and second gradient coils; and
a processor configured to actuate the switch prior to detection of the NMR signal with the detector.

22. The apparatus of claim 21, further comprising a third set of gradient coils disposed with respect to the first and second sets of gradient coils.

23. The apparatus of claim 21, wherein the first and second sets of gradient coils are disposed geometrically orthogonal to each other.

24. The apparatus of claim 21, wherein at least one of the first or second sets of gradient coils comprise a Maxwell pair.

25. The apparatus of claim 24, wherein the Maxwell pair is configured to generate a magnetic field substantially of a form $a(-xx-yy+2zz)$ when driven by the current supply module, wherein:
a is a scalar dependent on geometry and current in the coils;
z is a unit vector along the first direction;
x is a unit vector that is perpendicular to z; and
y is a unit vector that is perpendicular to both z and x.

26. The apparatus of claim 21, wherein at least one of the first or second sets of gradient coils comprise a saddle coil.

27. The apparatus of claim 21, wherein at least one of the first or second sets of gradient coils comprise a Golay pair.

28. The apparatus of claim 27, wherein the Golay pair is configured to generate a magnetic field substantially of a form $a(zx+xz)$ when driven by the current supply module, wherein:
a is a scalar dependent on the geometry of and current in the coils;
z is a unit vector along the first direction; and
x is a unit vector that is perpendicular to z and y.

29. The apparatus of claim 27, wherein the Golay pair is configured to generate a magnetic field substantially of a form $a(zy+yz)$ when driven by the current supply module, wherein:
a is a scalar dependent on the geometry of and current in the coils;
z is a unit vector along the first direction; and
y is a unit vector that is perpendicular to z and x.

30. The apparatus of claim 27, wherein the Golay pair is configured to generate a magnetic field substantially of a form a(yx+xy) when driven by the current supply module, wherein:
   a is a scalar dependent on the geometry of and current in the coils;
   x is a unit vector perpendicular to z, a unit vector along the first direction; and
   y is a unit vector that is perpendicular to both z and x.

31. The apparatus of claim 21, wherein the first set of gradient coils comprise a first Golay pair and the second set of gradient coils comprise a second Golay pair, wherein the first and second Golay pairs are co-axial and geometrically orthogonal to each other, wherein the first Golay pair is configured to generate a magnetic field substantially of a form a(zx+xz) when driven by the current supply module and wherein the second Golay pair is configured to generate a magnetic field substantially of a form a(zy+yz) when driven by the current supply module, wherein:
   a and b are scalars dependent on the geometry of and current in the coils;
   z is a unit vector along the first direction;
   x is a unit vector that is perpendicular to z; and
   y is a unit vector that is perpendicular to both z and x.

32. The apparatus of claim 21, wherein the first set of gradient coils comprise a Golay pair and the second set of gradient coils comprise a Maxwell pair, wherein the axis of the Golay pair is orthogonal to the axis of the Maxwell pair, wherein the Golay pair is configured to generate a magnetic field substantially of a form a(yx+xy) when driven by the current supply module and wherein the Maxwell pair is configured to generate a magnetic field substantially of a form b(-xx-yy+2zz) when driven by the current supply module, wherein:
   a and b are scalars dependent on the geometry of and current in the coils;
   z is a unit vector along the first direction;
   x is a unit vector that is perpendicular to z; and
   y is a unit vector that is perpendicular to both z and x.

33. The apparatus of claim 21, wherein the two alternating currents are phase-orthogonal to each other.

34. The apparatus of claim 33, wherein the two alternating currents are sinusoidal currents of angular frequency ω that are 90° out of phase with respect to each other.

35. The apparatus of claim 34, wherein the angular frequency ω is about at a Larmor frequency of a chemical species desired to be detected.

36. The apparatus of claim 21, wherein the detector is an induction coil.

37. The apparatus of claim 21, wherein the detector is a Superconducting Quantum Interference (SQUID) magnetometer.

38. A method of magnetic resonance imaging (MRI), the method comprising:
   a) a pre-polarizing a sample by:
      applying a prepolarization field $B_P$ for a period of time, and
      switching the prepolarization field off;
   b) providing a static magnetic field $B_0$ along a z unit vector at the sample;
   c) selecting a volume for imaging by applying a frequency-selective pulse in the presence of a rotating-frame magnetic field gradient superimposed on the $B_0$ field, wherein the rotating-frame gradient comprises a vector component rotating in a plane perpendicular to the z unit vector;
   d) spatially encoding nuclear spins in the selected volume; and
   e) detecting a spatially encoded nuclear magnetic resonance signal.

39. The method of claim 38, wherein the selecting comprises applying a hard pulse to excite substantially all spins in the sample and applying a soft pulse to de-excite substantially only those spins within the selected volume.

40. The method of claim 38, wherein the selecting comprises applying a soft pulse to excite substantially only those spins within the selected volume.

41. The method of claim 38, wherein the selective pulse comprises a soft pulse intermittently interrupted by one or more coherent hard pulses.

42. The method of claim 41, wherein each of the hard pulses is selected from a group of hard pulses consisting of:
   a) a $\pi_y$ pulse rotating substantially all of the magnetization M into the y direction;
   b) a $\pi_{-y}$ pulse rotating substantially all of the magnetization M into the -y direction;
   c) a $\pi_z$ pulse rotating substantially all of the magnetization M into the z direction; and
   d) a $\pi_{-z}$ pulse rotating substantially all of the magnetization M into the -z direction.

43. The method of claim 42, wherein the selective pulse comprises the sequence:

$$\{2\tau-(\pi_y)-\tau-(\pi_z)-2\tau-(\pi_{-z})-\tau-(\pi_{-y})-2\tau\}_n, \text{wherein:}$$

τ and 2τ indicate delay intervals in which a segment of the soft pulse is applied; and
   n is an index indicating $n^{th}$ cycle in repetitive applications of the selective pulse.

44. The method of claim 43, wherein the delay interval τ is about three orders of magnitude less than the total pulse duration.

45. The method of claim 38, wherein the spatial encoding comprises Fourier encoding by application of a second rotating-frame magnetic field gradient.

46. The method of claim 38, wherein the rotating-frame gradient comprises a time-independent z gradient along a transverse direction in a rotating frame.

47. The method of claim 38, wherein the rotating-frame gradient comprises a time-independent x gradient along a transverse direction in a rotating frame.

48. The method of claim 38, wherein the rotating-frame gradient comprises a time-independent y gradient along a transverse direction in a rotating frame.

49. A method of performing magnetic resonance imaging (MRI), the method comprising:
   a) pre-polarizing a sample by:
      applying a prepolarization field $B_P$ for a period of time, and
      switching the prepolarization field off;
   b) providing a static magnetic field $B_0$;
   c) selecting a slice for imaging by applying a frequency-selective pulse in the presence of a first rotating-frame gradient superimposed on the $B_0$ field;
   d) performing a plurality of data acquisitions of nuclear magnetic resonance signals from the selected slice, each data acquisition comprising:
      Fourier encoding spins within the slice by applying a second rotating-frame gradient superimposed on the $B_0$ field,
      detecting a Fourier encoded nuclear magnetic resonance signal, and
      populating a k-space with the detected nuclear magnetic resonance signal;

e) terminating the data acquisitions when the population of the k-space is completed;
f) performing an inverse Fourier transformation on the populated k-space; and
g) displaying an image indicative of local spin density distribution in the selected slice.

50. A magnetic resonance imaging (MRI) system comprising:
a) means for providing a pre-polarization magnetic field;
b) means for providing a static magnetic field;
c) means for generating a first rotating-frame gradient and a second rotating-frame gradient;
d) means for generating a selective pulse applied in the presence of the first rotating-frame gradient;
e) means for phase encoding a plurality of MRI signals by the use of the second rotating-frame gradient;
f) means for performing an inverse Fourier transformation on the phase-encoded MRI signals; and
g) means for displaying an image indicative of local spin density distribution in a slice selected by the selective pulse.

* * * * *